United States Patent
Maru

(10) Patent No.: US 7,133,472 B2
(45) Date of Patent: Nov. 7, 2006

(54) HIGH-SPEED TURBO DECODER

(75) Inventor: Tsuguo Maru, Tokyo (JP)

(73) Assignee: NEC Corporation (JP)

( * ) Notice: Subject to any disclaimer, the term of this patent is extended or adjusted under 35 U.S.C. 154(b) by 830 days.

(21) Appl. No.: 09/853,968

(22) Filed: May 11, 2001

(65) Prior Publication Data

US 2002/0062471 A1    May 23, 2002

(30) Foreign Application Priority Data

May 12, 2000    (JP)    ............... 2000-139493

(51) Int. Cl.
*H04M 13/00*    (2006.01)
*H04L 27/06*    (2006.01)

(52) U.S. Cl. .............. 375/341; 714/780; 714/755

(58) Field of Classification Search ............ 375/341, 375/340, 262, 265; 714/795, 755, 780, 794, 714/786, 796, 792; 371/43.7, 43.8
See application file for complete search history.

(56) References Cited

U.S. PATENT DOCUMENTS

| | | | | |
|---|---|---|---|---|
| 5,933,462 A | * | 8/1999 | Viterbi et al. ............... | 375/341 |
| 6,028,899 A | | 2/2000 | Petersen | |
| 6,161,209 A | * | 12/2000 | Moher ......................... | 714/780 |
| 6,192,084 B1 | * | 2/2001 | Miyauchi et al. ............ | 375/262 |
| 6,192,501 B1 | * | 2/2001 | Hladik et al. ............... | 714/786 |
| 6,304,995 B1 | * | 10/2001 | Smith et al. ................ | 714/786 |
| 6,304,996 B1 | * | 10/2001 | Van Stralen et al. ........ | 714/796 |
| 6,343,368 B1 | * | 1/2002 | Lerzer ....................... | 714/796 |
| 6,484,283 B1 | * | 11/2002 | Stephen et al. ............. | 714/786 |
| 6,606,725 B1 | * | 8/2003 | Wang et al. ................ | 714/755 |
| 6,718,504 B1 | * | 4/2004 | Coombs et al. ............. | 714/755 |
| 6,748,034 B1 | * | 6/2004 | Hattori et al. .............. | 375/341 |
| 6,810,094 B1 | * | 10/2004 | Lu .............................. | 375/341 |

FOREIGN PATENT DOCUMENTS

| | | |
|---|---|---|
| JP | 2-76072 | 3/1990 |
| JP | 3-131969 | 6/1991 |
| JP | 8-241335 | 9/1996 |
| JP | 2798123 | 7/1998 |
| JP | 10-303801 | 11/1998 |
| JP | 11-74800 | 3/1999 |

(Continued)

OTHER PUBLICATIONS

Pipelined architectures for the Viterbi algorithm;Boo, M.; Brugera, J.D.; TENCON '97. IEEE Region 10 Annual Conference. Speech and Image Technologies for Computing and Telecommunications'., Proceedings of IEEE vol. 1, Dec. 2-4, 1997 pp. 239-242 vol.*

(Continued)

*Primary Examiner*—Temesghen Ghebretinsae
*Assistant Examiner*—Jacob Meek
(74) *Attorney, Agent, or Firm*—Dickstein, Shapiro, Morin & Oshinsky, LLP.

(57) ABSTRACT

A high-speed turbo decoder using a BCJR (Bahi, Cocke, Jelinek, and Raviv) algorithm or a BCJR algorithm which makes approximation by ACS computation (Add-Compare-Select computation) includes a supplier for supplying a plurality of pipelined stages of gamma metrics as a section for performing at least one of alpha metric computation and beta metric computation in the BCJR algorithm, an ACS computation portion which is constituted by a plurality of stages of cascade connections and receives the plurality of pipelined gamma metrics, a receiver that receives a computation result obtained by the ACS computation portion and updates state metrics every plurality of stages (K stages), and a memory for storing state metrics for every K stages.

33 Claims, 16 Drawing Sheets

FOREIGN PATENT DOCUMENTS

| | | |
|---|---|---|
| JP | 2000-49625 | 2/2000 |
| JP | 2001-024521 | 1/2001 |
| JP | 2001-267938 | 9/2001 |
| WO | WO 00/38366 | 6/2000 |

OTHER PUBLICATIONS

A Viterbi decoder architecture based on parallel processing elements; Meier, S.R.; Global Telecommunications Conference, 1990, and Exhibition. 'Communications: Connecting the Future', GLOBECOM '90., IEEE; Dec. 2-5, 1990 pp. 1323-1327 vol. 2.*

A 1-Gb/s, four-state, sliding block Viterbi decoder; Black, P.J.; Meng, T.H.-Y.; Solid-State Circuits, IEEE Journal of vol. 32, Issue 6, Jun. 1997 pp. 797-805.*

Japanese Office Action issued Jun. 17, 2003 (w/ English translation of relevant portion).

Schurgers C., et al., "Energy Efficient Data Transfer and Storage Organization for a MAP Turbo Decoder Module," Proceedings 1999 International Symposium on Low Power Electronics and Design, San Diego, CA (Aug. 1999), International Symposium on Low Poer Electronics and Design, New York, NY (Aug. 1999), pp. 76-81.

Fettweis G., et al., "High-Rate Viterbi Processor: A Systolic Array Solution," IEEE Journal on Selected Area in Communications, IEEE Inc., (Oct. 1990), New York, US, vol. 8, No. 8, pp. 1520-1534.

Dawid H., et al., "Real-Time Algorithms and VLSI Architectures for Soft Output MAP Convolutional Decoding," Proc. of Symposium on Personal, Indoor and Mobile Radio Communication 1995, Toronto, Ont., Canada (Sep. 1995), pp. 193-197.

Dawid H. et al., "A CMOS IC for Gb/s Viterbi Decoding: System Design and VLSI Implementation," IEEE Transactions on Very Large Scale Integration (VLSI) Systems, IEEE Inc., New York, vol. 4, No. 1,(Mar. 1996), pp. 17-31.

Viglione F., et al., "A 50 Mbit/s Iterative Turbo-Decoder," Proceedings of the Meeting on Design Automation and Test in Europe, Paris and France (Mar. 2000), pp. 176-180.

\* cited by examiner

HIGH-SPEED TURBO DECODER

BACKGROUND OF THE INVENTION

1. Field of the Invention

The present invention relates to a turbo decoder and, more particularly, to a turbo decoder which can decrease a time lag, operate at high speed, and hardly deteriorates in characteristics.

2. Description of the Prior Art

A new encoding method called turbo codes which can attain a decoding error rate near the Shannon limit has been proposed by Berrou et al. This method is disclosed in detail in "Proc. IEEE International Conference on Communication (ICC)", May 1993, pp. 1064–1070.

A characteristic feature of this turbo code decoding is that a code with high decoding complexity is decomposed into elements with low complexity, and the characteristics are sequentially improved by the interaction between the elements. As a decoder for decomposing a code into small elements, a MAP (MAximum Posteriori likelihood) decoder is used, which performs soft-input/soft-output decoding. Although the BCJR (Bahl, Cocke, Jelinek, and Raviv) algorithm is known as a technique for faithfully implementing this MAP decoding, this requires a large calculation amount. As a technique of reducing the calculation amount by approximation, an algorithm such as Max-LogMAP or SOVA is known. Max-LogMAP is designed to approximate the computation process in BCJR with a logarithmic domain. SOVA is designed to obtain soft-input/soft-output data on the basis of the Viterbi algorithm.

Although a characteristic feature of turbo code decoding is that a code with high decoding complexity is decomposed into elements with low complexity, and the characteristics are sequentially improved by the interaction between the elements, it requires iterative operation, and hence it is difficult to realize high-speed operation.

To overcome this drawback, two types of methods may be used. First, in the method shown in FIG. 15, a plurality of turbo decoders each capable of performing N iterations of decoding are made to operate concurrently while being switched by switches; an improvement in average processing throughput can be expected owing to the concurrent processing. As shown in FIG. 15, however, there is a time lag between input operation and output operation. That is, this method is not suited to communication demanding interactive operation. In addition, as shown in FIG. 15, each turbo decoder requires a memory for iterative operation for soft decision data. The ratio of memory operation to overall processing is high, resulting in a large circuit size.

FIG. 16 shows another method. In this method, a plurality of turbo decoders each capable of one iteration of decoding are cascaded to perform pipeline processing. In this case as well, there is a time lag between input operation and output operation, and hence this method is not suited to communication demanding interactive operation. As in the above case, each decoder requires a memory for exchanging soft decision information, resulting in a large circuit size.

Although high-speed operation can be realized by using SOVA designed to perform approximation to obtain soft-input/soft-output data on the basis of the Viterbi algorithm, a deterioration in characteristics occurs due to the approximation.

Services required in next-generation mobile communication systems are classified according to Qos (Quality of service). Time lag is an important factor in a class to which VoIP (Voice over IP) and teleconferences which demand high interactive performance belong.

SUMMARY OF THE INVENTION

The present invention has been made in consideration of the above situation in the prior art, and has as its first object to provide a high-speed turbo decoder having a strong error correction means which can be used for communication demanding high speed and interactive performance. That is, the present invention is designed to realize a high-speed turbo decoder having strong error correction performance without increasing a circuit size, e.g., an increase in the capacity of a memory for exchanging soft decision information caused by parallel processing.

In order to achieve the above object, according to a first main aspect of the present invention, there is provided a high-speed turbo decoder using a BCJR (Bahl, Cocke, Jelinek, and Raviv) algorithm or a BCJR algorithm which makes approximation by ACS (Add-Compare-Select) computation, comprising, in order to perform at least one of alpha metric computation and beta metric computation in the BCJR algorithm: means for supplying a plurality of pipelined stages of gamma metrics; ACS computation means constituted of a plurality of stages of cascade connections which receives the plurality of pipelined gamma metrics; means for receiving a computation result obtained by the ACS computation means and thereby updating state metrics every plurality of stages (K stages); and means for storing state metrics for every K stages.

The state metric updating means in the first main aspect is of a sliding window type, and therefore update progress of each of state metrics is indicated.

In order to achieve the above object, according to a second main aspect, there is provided a high-speed turbo decoder using a BCJR (Bahl, Cocke, Jelinek, and Raviv) algorithm or a BCJR algorithm which makes approximation by ACS (Add-Compare-Select) computation, comprising, in order to perform at least one of alpha metric computation and beta metric computation in the BCJR algorithm: means for supplying a plurality of pipelined stages of gamma metrics; ACS computation means constituted of a plurality of stages of cascade connections which receives the plurality of pipelined gamma metrics; means for receiving a computation result obtained by the ACS computation means and thereby updating state metrics every plurality of stages (K stages); and another ACS computation means constituted of a plurality of stages of cascade connections which receives state metric updating results for every K stages and a plurality of pipelined stages of gamma metrics, wherein likelihood computation is performed on the basis of a computation result obtained by each stage of the ACS computation means constituted by the cascade connections.

In the second main aspect, computation results obtained by the respective stages of another ACS computation means which are constituted by a plurality of cascade connections and receive state metric updating results for every K stages and gamma metrics at the plurality of pipelined stages are computation results on state and gamma metrics used in another ACS computation, and likelihood computation is performed on the basis of the computation results.

In order to achieve the above object, according to a third main aspect of the present invention, there is provided a high-speed turbo decoder using a BCJR (Bahl, Cocke, Jelinek, and Raviv) algorithm or a BCJR algorithm which makes approximation by ACS (Add-Compare-Select) computation, comprising, in order to perform at least one of alpha metric computation and beta metric computation in the BCJR algorithm: means for receiving values of stored state metrics for every plurality of stages (K stages) as first inputs and thereby supplying a plurality of pipelined stages of gamma metrics; and ACS computation means constituted of a plurality of stages of cascade connections which receives the plurality of pipelined stages of gamma metrics as second inputs, wherein likelihood computation is performed on the basis of computation results at the respective stages of the ACS computation means constituted of the cascade connections.

In order to achieve the above object, according to the fourth main aspect of the present invention, there is provided a high-speed turbo decoder using a BCJR (Bahl, Cocke, Jelinek, and Raviv) algorithm or a BCJR algorithm which makes approximation by ACS (Add-Compare-Select) computation, comprising:

(a) a first section including, in order to perform at least one of alpha metric computation and beta metric computation in the BCJR algorithm: means for supplying a plurality of pipelined stages of gamma metrics; ACS computation means constituted of a plurality of stages of cascade connections which receives the plurality of pipelined stages of gamma metrics; means for receiving computation results obtained by the ACS computation means and thereby updating state metrics every plurality of stages (K stages); and means for storing the state metrics for every plurality of stages, (b) a second section including, in order to perform the other one of alpha metric computation and beta metric computation in the BCJR algorithm: means for supplying a plurality of pipelined stages of gamma metrics; ACS computation means constituted of a plurality of stages of cascade connections which receives the plurality of pipelined stages of gamma metrics; means for receiving computation results obtained by the ACS computation means and thereby updating state metrics every plurality of stages (K stages); and another ACS computation means constituted of a plurality of stages of cascade connections which receives state metric updating results for every K stages and the plurality of pipelined stages of gamma metrics; wherein a computation result from each stage of another ACS computation means constituted of the cascade connections becomes a first input for likelihood computation; and (c) a third section including: means for supplying a plurality of pipelined stages of gamma metrics; and still another ACS computation means constituted by a plurality of stages of cascade connections which receives values of the stored state metrics for every K stages as first inputs and receives the plurality of pipelined stages of gamma metrics as second inputs; wherein a computation result from each stage of still another computation means constituted by the cascade connections becomes a second input for likelihood computation, thus the likelihood computation is performed while the first and second inputs for the likelihood computation are synchronized with each other by using delay means.

In the high-speed turbo decoder according to the first main aspect, out of plural stages of computations by the ACS computation means constituted of the plurality of stages of cascade connections, computation at a first stage becomes addition, and a second and subsequent stages become computations each constructed by a trellis structure constituted of parallel components.

In the high-speed turbo decoder according to the first main aspect, the means for updating the state metrics every plurality of stages (K stages) is adapted to receive ACS computation results, as first inputs, sent from all nodes indicating states before updating to the respective nodes indicating states after updating and receive computation results obtained by the ACS computation means, as second inputs, constituted of the plurality of stages of cascade connections, whereby ACS computation based on inputs corresponding to the number of nodes indicating states is performed.

In the high-speed turbo decoder according to the second main aspect, out of plural stages of computations by the ACS computation means which receives the plurality of pipelined stages of gamma metrics, computation at a first stage becomes addition, and a second and subsequent stages become computations by the ACS computation means constructed by a trellis structure constituted of parallel components.

In the high-speed turbo decoder according to the second main aspect, the means for updating the state metrics every plurality of stages (K stages) is adapted to receive computation results, as first inputs, sent from all nodes indicating states before updating to the respective nodes indicating states after updating and receive computation results, as second inputs, obtained by the ACS computation means constituted of the plurality of stages of cascade connections, whereby ACS computation based on inputs corresponding to the number of nodes indicating states is performed.

The high-speed turbo decoder according to the first to fourth main aspects has the following secondary aspects.

A parallel or series concatenation encoding method is used as a turbo code encoding method.

Further, in the ACS computation, correction values based on a Jacobian logarithm are added.

As is clearly understood from the foregoing respective aspects, according to the present invention, there is provided a high-speed turbo decoder which has a strong error correction ability with a short time lag, and is suited to Qos that requires services with high interactive performance.

In addition, there is provided a high-speed turbo decoder which has a small memory required for iterative use of soft decision data and hence has a small circuit size.

According to the present invention, there is provided a high-speed turbo decoder which can perform high-speed operation without using SOVA which makes approximation to obtain soft-input/soft-output data on the basis of the Viterbi algorithm, and hence is almost free from a deterioration in characteristics due to approximation.

If the Jacobian logarithm is applied to each ACS computation, since a computation equivalent to the BCJR algorithm using MAP is performed, a turbo decoder can be provided, which has a strong error correction ability without causing a deterioration in characteristics.

As described above, according to the high-speed turbo decoder of the present invention, there is provided a high-speed turbo decoder which can provide a strong error correction means in communication demanding high-speed characteristics and interactive performance, and has an error correction means with a short time lag without increasing the memory capacity and circuit size.

In addition, the high-speed turbo decoder of the present invention can be applied to parallel concatenation turbo code encoding or series concatenation turbo code encoding, and can be flexibly configured in accordance with a required Qos.

Furthermore, the high-speed turbo decoder of the present invention allows application of the Jacobian logarithm and can improve error correction ability.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENTS

Several preferred embodiments of the present invention will be described below with reference to the accompanying drawings.

Figure 1:
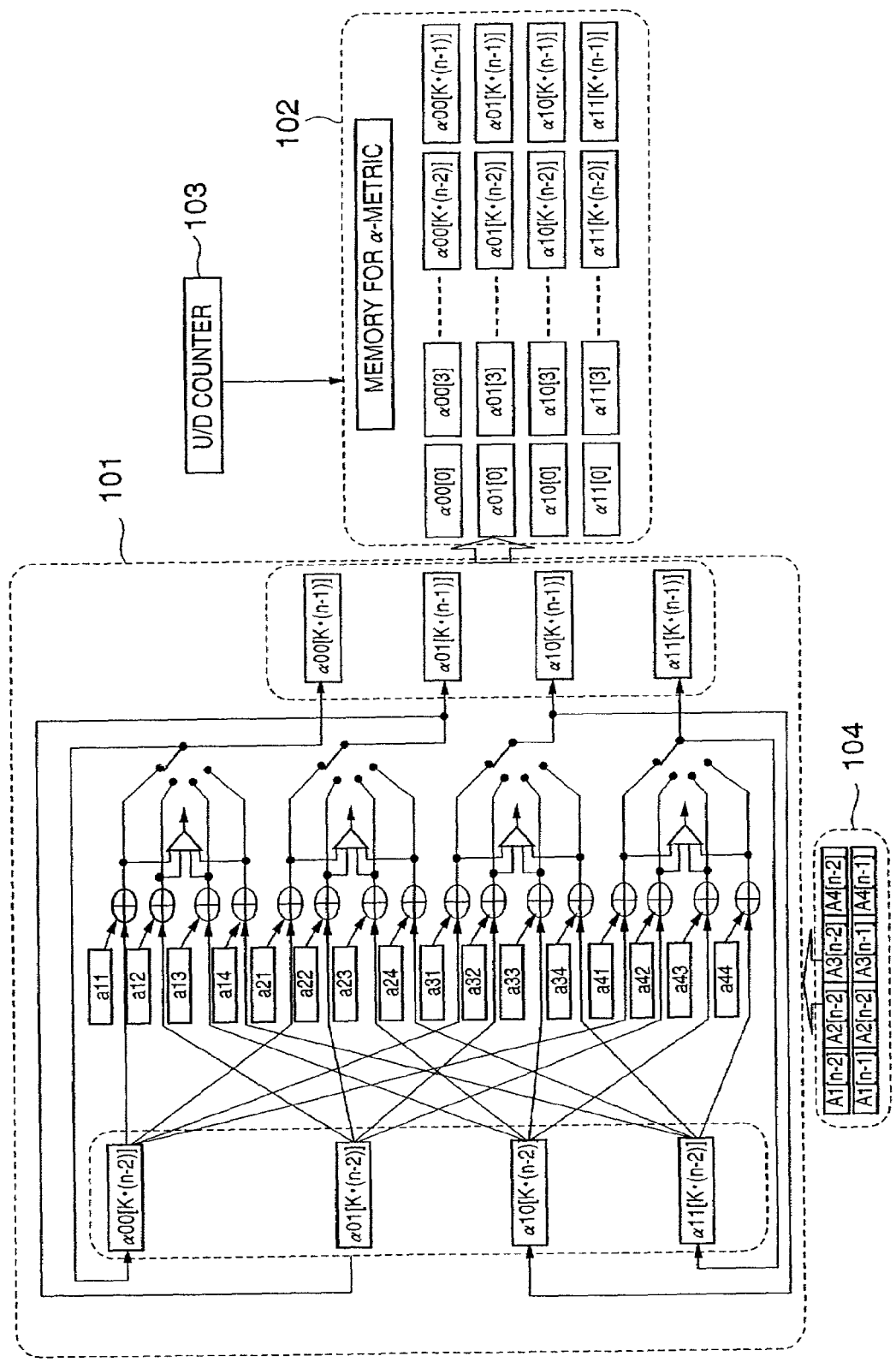
FIG. 1 is a block diagram showing an embodiment in which alpha metric computation is performed by using a high-speed turbo decoder according to the present invention.

FIG. 1 shows a case where the BCJR algorithm based on approximation by ACS computation. In this embodiment, alpha metric computation is performed in a high-speed turbo decoder. The concept of semiring will be described first before the description of the embodiment, for it is known that an update process by ACS computation can be expressed by a semiring which is an abstract algebraic system defined by two types of computations. For example, such a technique is disclosed in "IEEE Transactions on information theory", July 1996, Vol. 42, No. 4, pp. 1072–1092.

A semiring is formed by a set semiRing in which two types of computations are defined:

$$(semiRing, \oplus, \otimes) \quad (1)$$

Three arbitrary elements $$(a, b, c \in semiRing) \quad (2)$$

satisfy the following relations:

Note): A semiring has no inverse element unlike a ring.

(Closure Law)

$$a \oplus b \in semiRing \quad (3)$$

$$a \otimes b \in semiRing \quad (4)$$

(Combination Law)

$$(a \oplus b) \oplus c = a \oplus (b \oplus c) \quad (5)$$

$$(a \otimes b) \otimes c = a \otimes (b \otimes c) \quad (6)$$

(Identity Element)

$$a \oplus m = m \oplus a = a \epsilon (\forall a \in semiRing) \quad (7)$$

$$a \otimes \underline{1} = \underline{1} \otimes a = a (\forall a \in semiRing) \quad (8)$$

(Zero Element)

$$a \otimes m = m \otimes a = m (\oplus a \in semiRing) \quad (9)$$

(Distributive Law)

$$a \otimes (b \oplus c) = a \otimes b \oplus a \otimes c \quad (10)$$

$$(b \oplus c) \otimes a = b \otimes a \oplus c \otimes a \quad (11)$$

The semiring having the above properties is fitted in ACS computation as follows:

$$a \oplus b \equiv \max\{a, b\} \quad (12)$$

$$a \otimes b \equiv a + b \quad (13)$$

That is, addition is replaced with the operation of selecting a larger one, and multiplication is replaced with normal addition. As a consequence, the above value m corresponds to $$-\infty \quad (14)$$

and $$\underline{1} \quad (15)$$

corresponds to the normal number "zero". With this replacement, it is obvious that an ACS computation be a semiring.

An update process for state metrics can be expressed by using semiring operators as follows:

$$S00[n+1] = \{\Gamma n(0,0) \otimes S00[n]\} \oplus \{\Gamma n(1,1) \otimes S10[n]\}$$

$$S01[n+1] = \{\Gamma n(1,1) \otimes S00[n]\} \oplus \{\Gamma n(0,0) \otimes S10[n]\}$$

$$S10[n+1] = \{\Gamma n(1,0) \otimes S01[n]\} \oplus \{\Gamma n(0,1) \otimes S11[n]\}$$

$$S11[n+1] = \{\Gamma n(0,1) \otimes S01[n]\} \oplus \{\Gamma n(1,0) \otimes S11[n]\} \quad (16)$$

In this case, S represents a state metric, its suffix represents the state, and the contents of [ ] represent a transition order. In addition, Γ represents a gamma metric, its suffix represents a transition order and a value that can be taken in each transition. The above equations are represented by an matrix expression:

$$\overline{S}[n+1] = \begin{bmatrix} S00[n+1] \\ S01[n+1] \\ S10[n+1] \\ S11[n+1] \end{bmatrix} \quad (17)$$

$$\overline{\Gamma n} = \begin{bmatrix} \Gamma n(0,0) & m & \Gamma n(1,1) & m \\ \Gamma n(1,1) & m & \Gamma n(0,0) & m \\ m & \Gamma n(1,0) & m & \Gamma n(0,1) \\ m & \Gamma n(0,1) & m & \Gamma n(1,0) \end{bmatrix} \quad (18)$$

Then, $$\dot{S}[n+1] = \overline{\Gamma n} \otimes \dot{S}[n] \quad (19)$$

$$= \begin{bmatrix} \Gamma n(0,0) & m & \Gamma n(1,1) & m \\ \Gamma n(1,1) & m & \Gamma n(0,0) & m \\ m & \Gamma n(1,0) & m & \Gamma n(0,1) \\ m & \Gamma n(0,1) & m & \Gamma n(1,0) \end{bmatrix} \otimes \begin{bmatrix} S00[n+1] \\ S01[n+1] \\ S10[n+1] \\ S11[n+1] \end{bmatrix}$$

$$= \begin{bmatrix} \{\Gamma n(0,0) \otimes S00[n]\} & \oplus m & \oplus \{\Gamma n(1,1) \otimes S10[n]\} & \oplus m \\ \{\Gamma n(01,1) \otimes S00[n]\} & \oplus m & \oplus \{\Gamma n(0,0) \otimes S10[n]\} & \oplus m \\ \oplus m & \{\Gamma n(0,0) \otimes S00[n]\} & \oplus m & \oplus \{\Gamma n(0,1) \otimes S11[n]\} \\ \oplus m & \{\Gamma n(0,1) \otimes S01[n]\} & \oplus m & \oplus \{\Gamma n(1,0) \otimes S11[n]\} \end{bmatrix}$$

$$= \begin{bmatrix} \{\Gamma n(0,0) \otimes S00[n]\} \oplus \{\Gamma n(1,1) \otimes S10[n]\} \\ \{\Gamma n(1,1) \otimes S00[n]\} \oplus \{\Gamma n(0,0) \otimes S10[n]\} \\ \{\Gamma n(1,0) \otimes S01[n]\} \oplus \{\Gamma n(0,1) \otimes S11[n]\} \\ \{\Gamma n(0,1) \otimes S01[n]\} \oplus \{\Gamma n(1,0) \otimes S11[n]\} \end{bmatrix}$$

The update process progresses with ACS computation as follows:

$$\overline{S}[n+2] = \overline{\Gamma n+1} \otimes \{\overline{\Gamma n} \otimes \overline{S}[n]\} \quad (20)$$

$$= \begin{bmatrix} \Gamma n+1(0,0) & m & \Gamma n(1,1) & m \\ \Gamma n+1(1,1) & m & \Gamma n(0,0) & m \\ m & \Gamma n+1(1,0) & m & \Gamma n+1(0,1) \\ m & \Gamma n+1(0,1) & m & \Gamma n+1(1,0) \end{bmatrix} \otimes \begin{bmatrix} \{\Gamma n(0,0) \otimes S00[n]\} \oplus \{\Gamma n(1,1) \otimes S10[n]\} \\ \{\Gamma n(1,1) \otimes S00[n]\} \oplus \{\Gamma n(0,0) \otimes S10[n]\} \\ \{\Gamma n(1,0) \otimes S01[n]\} \oplus \{\Gamma n(0,1) \otimes S11[n]\} \\ \{\Gamma n(0,1) \otimes S01[n]\} \oplus \{\Gamma n(1,0) \otimes S11[n]\} \end{bmatrix}$$

$$= \begin{bmatrix} \{\Gamma n+1(0,0)\} \otimes [\{\Gamma n(0,0) \otimes S00[n]\} \oplus \{\Gamma n(1,1) \otimes S10[n]\}] & \oplus m \\ \{\Gamma n+1(1,1)\} \otimes [\{\Gamma n(0,0) \otimes S00[n]\} \oplus \{\Gamma n(1,1) \otimes S10[n]\}] & \oplus m \\ m & \oplus \{\Gamma n+1(1,0)\} \otimes [\{\Gamma n(1,1) \otimes S00[n]\} \oplus \{\Gamma n(0,0) \otimes S10[n]\}] \\ m & \oplus \{\Gamma n+1(1,0)\} \otimes [\{\Gamma n(1,1) \otimes S00[n]\} \oplus \{\Gamma n(0,0) \otimes S10[n]\}] \\ \oplus \{\Gamma n+1(1,1)\} \otimes [\{\Gamma n(1,0) \otimes S01[n]\} \oplus \{\Gamma n(0,1) \otimes S11[n]\}] & \oplus m \\ \oplus \{\Gamma n+1(0,0)\} \otimes [\{\Gamma n(1,0) \otimes S01[n]\} \oplus \{\Gamma n(0,1) \otimes S11[n]\}] & \oplus m \\ \oplus m & \oplus \{\Gamma n+1(0,1)\} \otimes [\{\Gamma n(0,1) \otimes S01[n]\} \oplus \{\Gamma n(1,0) \otimes S11[n]\}] \\ \oplus m & \oplus \{\Gamma n+1(1,0)\} \otimes [\{\Gamma n(0,1) \otimes S01[n]\} \oplus \{\Gamma n(1,0) \otimes S11[n]\}] \end{bmatrix}$$

$$= \begin{bmatrix} \{\Gamma n+1(0,0)\} \otimes [\{\Gamma n(0,0) \otimes S00[n]\} \oplus \{\Gamma n(1,1) \otimes S10[n]\}] \oplus \{\Gamma n+1(1,1)\} \otimes [\{\Gamma n(1,0) \otimes S01[n]\} \oplus \{\Gamma n(0,1) \otimes S11[n]\}] \\ \{\Gamma n+1(1,1)\} \otimes [\{\Gamma n(0,0) \otimes S00[n]\} \oplus \{\Gamma n(1,1) \otimes S10[n]\}] \oplus \{\Gamma n+1(0,0)\} \otimes [\{\Gamma n(1,0) \otimes S01[n]\} \oplus \{\Gamma n(0,1) \otimes S11[n]\}] \\ \{\Gamma n+1(1,0)\} \otimes [\{\Gamma n(1,1) \otimes S00[n]\} \oplus \{\Gamma n(0,0) \otimes S10[n]\}] \oplus \{\Gamma n+1(0,1)\} \otimes [\{\Gamma n(0,1) \otimes S01[n]\} \oplus \{\Gamma n(1,0) \otimes S11[n]\}] \\ \{\Gamma n+1(1,0)\} \otimes [\{\Gamma n(1,1) \otimes S00[n]\} \oplus \{\Gamma n(0,0) \otimes S10[n]\}] \oplus \{\Gamma n+1(1,0)\} \otimes [\{\Gamma n(0,1) \otimes S01[n]\} \oplus \{\Gamma n(1,0) \otimes S11[n]\}] \end{bmatrix}$$

On the other hand,

-continued $$\overline{\Gamma n+1} \otimes \overline{\Gamma n} = \begin{bmatrix} \Gamma n+1(0,0) & m & \Gamma n+1(1,1) & m \\ \Gamma n+1(1,1) & m & \Gamma n+1(0,0) & m \\ m & \Gamma n+1(1,0) & m & \Gamma n+1(0,1) \\ m & \Gamma n+1(0,1) & m & \Gamma n+1(1,0) \end{bmatrix} \otimes \begin{bmatrix} \Gamma n(0,0) & m & \Gamma n(1,1) & m \\ \Gamma n(1,1) & m & \Gamma n(0,0) & m \\ m & \Gamma n(1,0) & m & \Gamma n(0,1) \\ m & \Gamma n(0,1) & m & \Gamma n(1,0) \end{bmatrix} \quad (21)$$

$$= \begin{bmatrix} \{\Gamma n+1(0,0)\otimes\Gamma n(0,0)\} & \{\Gamma n+1(1,1)\otimes\Gamma n(1,0)\} & \{\Gamma n+1(0,0)\otimes\Gamma n(1,1)\} & \{\Gamma n+1(1,1)\otimes\Gamma n(0,1)\} \\ \{\Gamma n+1(1,1)\otimes\Gamma n(0,0)\} & \{\Gamma n+1(0,0)\otimes\Gamma n(0,0)\} & \{\Gamma n+1(1,1)\otimes\Gamma n(1,1)\} & \{\Gamma n+1(0,0)\otimes\Gamma n(0,1)\} \\ \{\Gamma n+1(1,0)\otimes\Gamma n(1,1)\} & \{\Gamma n+1(0,1)\otimes\Gamma n(0,1)\} & \{\Gamma n+1(1,0)\otimes\Gamma n(0,0)\} & \{\Gamma n+1(0,1)\otimes\Gamma n(1,0)\} \\ \{\Gamma n+1(0,1)\otimes\Gamma n(1,1)\} & \{\Gamma n+1(1,0)\otimes\Gamma n(0,1)\} & \{\Gamma n+1(0,1)\otimes\Gamma n(0,0)\} & \{\Gamma n+1(1,0)\otimes\Gamma n(1,0)\} \end{bmatrix}$$

Therefore, $$\dot{S}[n+2] = \{\overline{\Gamma n+1}\otimes\overline{\Gamma n}\}\otimes\dot{S}[n] = \quad (22)$$

$$\begin{bmatrix} \{\Gamma n+1(0,0)\otimes\Gamma n(0,0)\otimes S00[n]\}\oplus\{\Gamma n+1(1,1)\otimes\Gamma n(1,0)\otimes S01[n]\}\oplus\{\Gamma n+1(0,0)\otimes\Gamma n(1,1)\otimes S10[n]\}\oplus\{\Gamma n+1(1,1)\otimes\Gamma n(0,1)\otimes S11[n]\} \\ \{\Gamma n+1(1,1)\otimes\Gamma n(0,0)\otimes S00[n]\}\oplus\{\Gamma n+1(0,0)\otimes\Gamma n(1,0)\otimes S01[n]\}\oplus\{\Gamma n+1(1,1)\otimes\Gamma n(1,1)\otimes S10[n]\}\oplus\{\Gamma n+1(0,1)\otimes\Gamma n(0,1)\otimes S11[n]\} \\ \{\Gamma n+1(1,0)\otimes\Gamma n(1,1)\otimes S00[n]\}\oplus\{\Gamma n+1(0,1)\otimes\Gamma n(0,1)\otimes S01[n]\}\oplus\{\Gamma n+1(1,0)\otimes\Gamma n(0,0)\otimes S10[n]\}\oplus\{\Gamma n+1(0,1)\otimes\Gamma n(1,0)\otimes S11[n]\} \\ \{\Gamma n+1(0,1)\otimes\Gamma n(1,1)\otimes S00[n]\}\oplus\{\Gamma n+1(1,0)\otimes\Gamma n(0,1)\otimes S01[n]\}\oplus\{\Gamma n+1(0,1)\otimes\Gamma n(0,0)\otimes S10[n]\}\oplus\{\Gamma n+1(1,0)\otimes\Gamma n(1,0)\otimes S11[n]\} \end{bmatrix}$$

As a consequence, $$\dot{S}[n+2] = \overline{\Gamma n+1}\otimes\{\overline{\Gamma n}\otimes\dot{S}[n]\} = \{\overline{\Gamma n+1}\otimes\overline{\Gamma n}\}\otimes\dot{S}[n] \quad (23)$$

Likewise, $$\overline{\Gamma n+2}\otimes\{\overline{\Gamma n+1}\otimes\overline{\Gamma n}\} =$$

$$\begin{bmatrix} \Gamma n+2(0,0) & m & \Gamma n+2(1,1) & m \\ \Gamma n+2(1,1) & m & \Gamma n+2(0,0) & m \\ m & \Gamma n+2(1,0) & m & \Gamma n+2(0,1) \\ m & \Gamma n+2(0,1) & m & \Gamma n+2(1,0) \end{bmatrix} \otimes \quad (24)$$

$$\begin{bmatrix} \{\Gamma n+1(0,0)\otimes\Gamma n(0,0)\} & \{\Gamma n+1(1,1)\otimes\Gamma n(1,0)\} & \{\Gamma n+1(0,0)\otimes\Gamma n(1,1)\} & \{\Gamma n+1(1,1)\otimes\Gamma n(0,1)\} \\ \{\Gamma n+1(1,1)\otimes\Gamma n(0,0)\} & \{\Gamma n+1(0,0)\otimes\Gamma n(1,0)\} & \{\Gamma n+1(1,1)\otimes\Gamma n(1,1)\} & \{\Gamma n+1(0,0)\otimes\Gamma n(0,1)\} \\ \{\Gamma n+1(1,0)\otimes\Gamma n(1,1)\} & \{\Gamma n+1(0,1)\otimes\Gamma n(0,1)\} & \{\Gamma n+1(1,0)\otimes\Gamma n(0,0)\} & \{\Gamma n+1(0,1)\otimes\Gamma n(1,0)\} \\ \{\Gamma n+1(0,1)\otimes\Gamma n(1,1)\} & \{\Gamma n+1(1,0)\otimes\Gamma n(0,1)\} & \{\Gamma n+1(0,1)\otimes\Gamma n(0,0)\} & \{\Gamma n+1(1,0)\otimes\Gamma n(1,0)\} \end{bmatrix} =$$

$$\begin{bmatrix} \{\Gamma n+2(0,0)\otimes\Gamma n+1(0,0)\otimes\Gamma n(0,0)\}\oplus\{\Gamma n+2(1,1)\otimes\Gamma n+1(1,0)\otimes\Gamma n(1,1)\} \\ \{\Gamma n+2(1,1)\otimes\Gamma n+1(0,0)\otimes\Gamma n(0,0)\}\oplus\{\Gamma n+2(0,0)\otimes\Gamma n+1(1,0)\otimes\Gamma n(1,1)\} \\ \{\Gamma n+2(1,0)\otimes\Gamma n+1(1,1)\otimes\Gamma n(0,0)\}\oplus\{\Gamma n+2(0,1)\otimes\Gamma n+1(0,1)\otimes\Gamma n(1,1)\} \\ \{\Gamma n+2(0,1)\otimes\Gamma n+1(1,1)\otimes\Gamma n(0,0)\}\oplus\{\Gamma n+2(1,0)\otimes\Gamma n+1(0,1)\otimes\Gamma n(1,1)\} \\ \{\Gamma n+2(0,0)\otimes\Gamma n+1(1,1)\otimes\Gamma n(1,0)\}\oplus\{\Gamma n+2(1,1)\otimes\Gamma n+1(0,1)\otimes\Gamma n(0,1)\} \\ \{\Gamma n+2(1,1)\otimes\Gamma n+1(1,1)\otimes\Gamma n(1,0)\}\oplus\{\Gamma n+2(0,0)\otimes\Gamma n+1(0,1)\otimes\Gamma n(0,1)\} \\ \{\Gamma n+2(1,0)\otimes\Gamma n+1(0,0)\otimes\Gamma n(1,0)\}\oplus\{\Gamma n+2(0,1)\otimes\Gamma n+1(1,1)\otimes\Gamma n(0,1)\} \\ \{\Gamma n+2(0,1)\otimes\Gamma n+1(0,0)\otimes\Gamma n(1,0)\}\oplus\{\Gamma n+2(1,0)\otimes\Gamma n+1(1,1)\otimes\Gamma n(0,1)\} \\ \{\Gamma n+2(0,0)\otimes\Gamma n+1(0,0)\otimes\Gamma n(1,1)\}\oplus\{\Gamma n+2(1,1)\otimes\Gamma n+1(1,0)\otimes\Gamma n(0,0)\} \\ \{\Gamma n+2(1,1)\otimes\Gamma n+1(0,0)\otimes\Gamma n(1,1)\}\oplus\{\Gamma n+2(0,0)\otimes\Gamma n+1(1,0)\otimes\Gamma n(0,0)\} \\ \{\Gamma n+2(1,0)\otimes\Gamma n+1(1,1)\otimes\Gamma n(1,1)\}\oplus\{\Gamma n+2(0,1)\otimes\Gamma n+1(0,1)\otimes\Gamma n(0,0)\} \\ \{\Gamma n+2(0,1)\otimes\Gamma n+1(1,1)\otimes\Gamma n(1,1)\}\oplus\{\Gamma n+2(1,0)\otimes\Gamma n+1(0,1)\otimes\Gamma n(0,0)\} \\ \{\Gamma n+2(0,0)\otimes\Gamma n+1(1,1)\otimes\Gamma n(0,1)\}\oplus\{\Gamma n+2(1,1)\otimes\Gamma n+1(1,0)\otimes\Gamma n(1,0)\} \\ \{\Gamma n+2(1,1)\otimes\Gamma n+1(1,1)\otimes\Gamma n(0,1)\}\oplus\{\Gamma n+2(0,0)\otimes\Gamma n+1(1,0)\otimes\Gamma n(1,0)\} \\ \{\Gamma n+2(1,0)\otimes\Gamma n+1(0,0)\otimes\Gamma n(0,1)\}\oplus\{\Gamma n+2(0,1)\otimes\Gamma n+1(1,0)\otimes\Gamma n(1,0)\} \\ \{\Gamma n+2(0,1)\otimes\Gamma n+1(0,0)\otimes\Gamma n(0,1)\}\oplus\{\Gamma n+2(1,0)\otimes\Gamma n+1(1,0)\otimes\Gamma n(1,0)\} \end{bmatrix}$$

The above equation can be expressed by $$\dot{S}[n+3] = \overline{\Gamma n+2}\otimes\{\overline{\Gamma n+1}\otimes\{\overline{\Gamma n}\otimes\dot{S}[n]\}\} = \{\overline{\Gamma n+2}\otimes\{\overline{\Gamma n+1}\otimes\overline{\Gamma n}\}\}\otimes\dot{S}[n] \quad (25)$$

This relationship holds for an arbitrary number. The above equation indicates that the state metrics sequentially obtained by updating state metrics with gamma metrics are the same as those obtained by performing computation using gamma metrics first:

$$\{\overline{\Gamma n+K-1}\otimes{}^{+++}\{\overline{\Gamma n+2}\otimes\{\overline{\Gamma n+1}\otimes\overline{\Gamma n}\}\}\} \quad (26)$$

then, performing update computation for the state metrics.

A bottleneck in ACS computation speed lies in feedback processing. Feedforward processing can be speeded up by a pipeline configuration. The above computation based on gamma metrics:

$$\{\overline{\Gamma n+K-1}\otimes{}^{+++}\{\overline{\Gamma n+2}\otimes\{\overline{\Gamma n+1}\otimes\overline{\Gamma n}\}\}\} \quad (27)$$

is feedforward processing, and hence can be done at high speed. By performing state metric updating operation using the result obtained by this processing, the Kth state metric can be obtained by one transition. In this embodiment, K=3.

However, the present invention can also be applied to a case where K is set to an arbitrary value. This embodiment will be described below by taking K=3 as an example. The computation result obtained by the above feedforward processing is expressed as follows:

$$\{\Gamma K \cdot (n-2) + 3 \otimes \{\Gamma K \cdot (n-2) + 1 \otimes \Gamma K \cdot (n-2)\}\} = \begin{bmatrix} a11 & a12 & a13 & a14 \\ a21 & a22 & a23 & a24 \\ a31 & a32 & a33 & a34 \\ a41 & a42 & a43 & a44 \end{bmatrix} \quad (28)$$

An update process for alpha metrics is expressed as follows:

If, $$\overline{\alpha[K \cdot (n-2)]} = \begin{bmatrix} \alpha 00[K \cdot (n-2)] \\ \alpha 01[K \cdot (n-2)] \\ \alpha 10[K \cdot (n-2)] \\ \alpha 11[K \cdot (n-2)] \end{bmatrix} \quad (29)$$

then, $$\overline{\alpha[K \cdot (n-1)]} = \begin{bmatrix} a11 & a12 & a13 & a14 \\ a21 & a22 & a23 & a24 \\ a31 & a32 & a33 & a34 \\ a41 & a42 & a43 & a44 \end{bmatrix} \otimes \begin{bmatrix} \alpha 00[K \cdot (n-2)] \\ \alpha 01[K \cdot (n-2)] \\ \alpha 10[K \cdot (n-2)] \\ \alpha 11[K \cdot (n-2)] \end{bmatrix} \quad (30)$$

$$= \begin{bmatrix} \{a11 \otimes a00[K \cdot (n-2)]\} \oplus \{a12 \otimes a01[K \cdot (n-2)]\} \oplus \{a13 \otimes a10[K \cdot (n-2)]\} \oplus \{a14 \otimes a11[K \cdot (n-2)]\} \\ \{a21 \otimes a00[K \cdot (n-2)]\} \oplus \{a22 \otimes a01[K \cdot (n-2)]\} \oplus \{a23 \otimes a10[K \cdot (n-2)]\} \oplus \{a24 \otimes a11[K \cdot (n-2)]\} \\ \{a31 \otimes a00[K \cdot (n-2)]\} \oplus \{a32 \otimes a01[K \cdot (n-2)]\} \oplus \{a33 \otimes a10[K \cdot (n-2)]\} \oplus \{a34 \otimes a11[K \cdot (n-2)]\} \\ \{a41 \otimes a00[K \cdot (n-2)]\} \oplus \{a42 \otimes a01[K \cdot (n-2)]\} \oplus \{a43 \otimes a10[K \cdot (n-2)]\} \oplus \{a44 \otimes a11[K \cdot (n-2)]\} \end{bmatrix}$$

An alpha metric updating circuit 101 in FIG. 1 corresponds to the above computation. Referring to FIG. 1, $$\oplus \quad (31)$$

represents general addition but differs from comparison/selection in the above semiring. As shown in FIG. 1, alpha metrics are updated every K=3 stages, and the computation results are stored in an alpha metric memory 102. A memory address for this storage is designated by an up/down counter 103. Note that reference numeral 104 denotes a gamma metric computation result.

In this embodiment, alpha metrics corresponding to one frame are stored. Obviously, however, the present invention can be applied as a sliding window type such that alpha metrics are stored every K stages within a window.

This makes it possible to reduce the memory capacity for alpha metrics to 1/K and multiply the update speed by K.

The operation of the alpha metric updating circuit 101 will be described next. Alpha metrics α00[[K·(n−2)], α01[[K·(n−2)], α10[[K·(n−2)], α11[[K·(n−2)] before updating form a register configuration and are connected to α00[[K·(n−1)], α01[[K·(n−1)], α10[[K·(n−1)], α11[[K·(n−1) ] after updating from nodes indicating all the alpha metrics through ACS computation processing; feedback connection is made to use newly produced alpha metrics as alpha metrics before updating. In this case, each ACS computation process uses 4-state encoding, and hence takes a 4-input configuration, to which the sums of ACS computation results a11 to a14, a21 to a24, a31 to a34, and a41 to a44, which are obtained by a plurality of stages of cascade connections receiving all the alpha metrics α00[[K·(n−2)], α01[[K·(n−2)], α10[[K·(n−2)], α11[[K·(n−2)] before updating and gamma metrics to be described later, are input.

The ACS computation at the uppermost portion in FIG. 1 will be described as an example. This computation corresponds to $$\alpha 00[K \cdot (n-1)] = \{\alpha 11 \widehat{x} \ \alpha 00[K \cdot (n-2)]\} \oplus \}\alpha 12 \widehat{x} \ \alpha 01[K \cdot (n-2)]\} \oplus \{\alpha 13 \widehat{x} \ \alpha 10[K \cdot (n-2)]\} \oplus \{\alpha 14 \widehat{x} \ \alpha 11[K \cdot (n-2)]\} \quad (32)$$

in the above equation. FIG. 1 and the equation correspond to each other in such a manner that each adder in FIG. 1 ⊕(33) is replaced with $$\widehat{x} \quad (34)$$

and the 4-input comparing/selecting circuit is replaced with $$\oplus \quad (35)$$

that computes four terms in the equation.

The same applies to other terms α01[[K·(n−1)], α10[[K·(n−1)], α11[[K·(n−1)].

The gamma metric computation result 104 in FIG. 1 expresses all to a14, a21 to a24, a31 to a34, and a41 to a44 in vectors, and has the following relationship:

$$A1[n-2] = [a11 \ a12 \ a13 \ a14] \quad (36)$$
$$A2[n-2] = [a21 \ a22 \ a23 \ a24]$$
$$A3[n-2] = [a31 \ a32 \ a33 \ a34]$$
$$A4[n-2] = [a41 \ a42 \ a43 \ a44]$$

To update the next alpha metrics, A1[n−1], A2[n−1], A3[n−1], and A4[n−1] are set on standby to be smoothly supplied.

A means of obtaining the ACS computation results a11 to a14, a21 to a24, a31 to a34, and a41 to a44, which receives gamma metrics and is constituted by a plurality of stages of cascade connections, will be described next with reference to FIG. 2.

Figure 2:
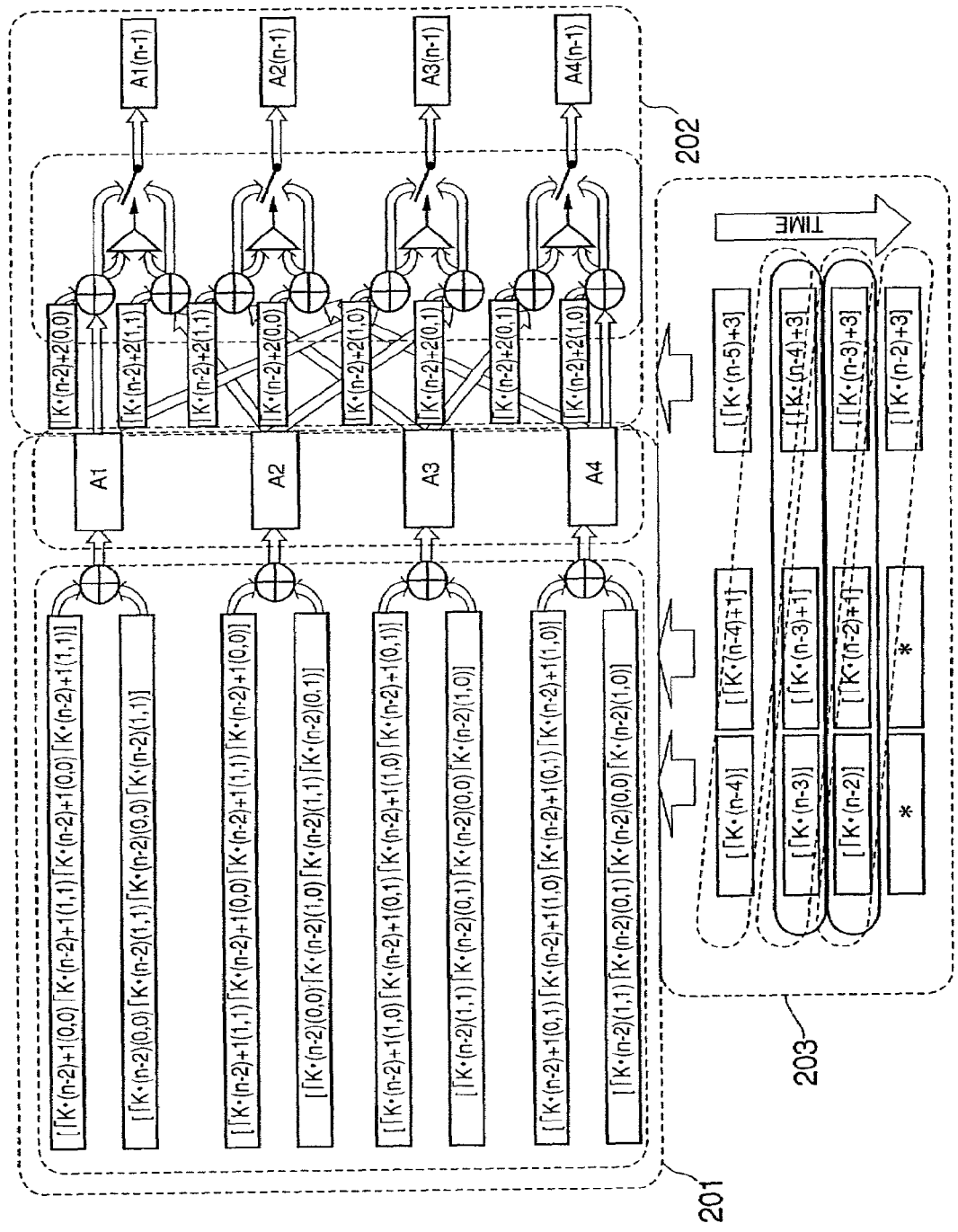
FIG. 2 is a block diagram showing an example of ACS computation constituted by a plurality of stages of cascade connections and using gamma metrics for alpha metric computation as inputs.
Figure 3:
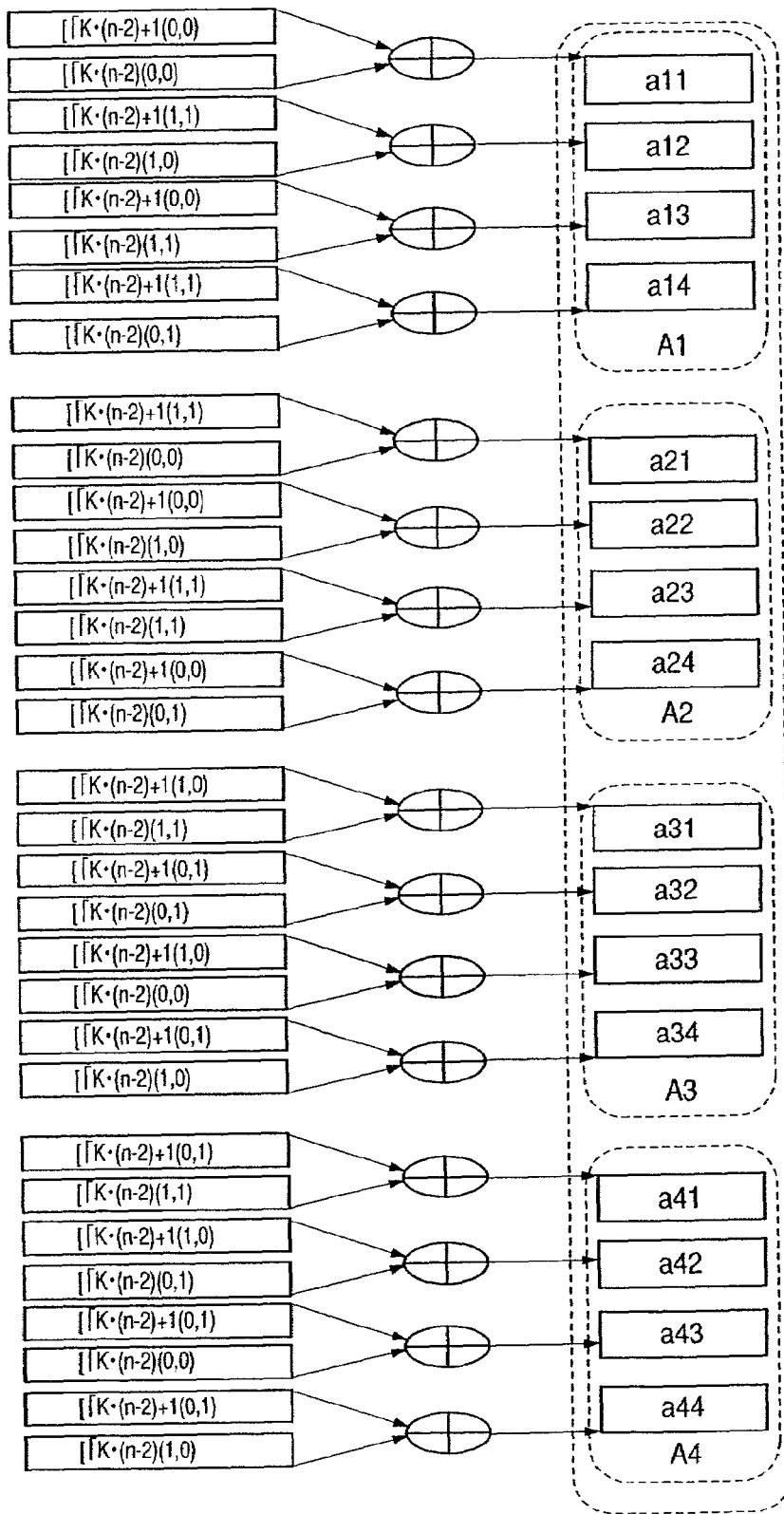
FIG. 3 is a block diagram showing an example of computation at the first stage in ACS computation constituted by a plurality of stages of cascade connections and using gamma metrics for alpha metric computation as inputs.

A first stage 201 in FIG. 2 represents addition of gamma metrics. FIG. 3 shows the detailed configuration for this operation. That is, the first stage performs the following computation:

$$\overline{\Gamma K \cdot (n-2)+1} \otimes \overline{\Gamma K \cdot (n-2)} \quad (37)$$

$$= \begin{bmatrix} \Gamma K \cdot (n-2)+1(0,0) & m & \Gamma K \cdot (n-2)+1(1,1) & m \\ \Gamma K \cdot (n-2)+1(1,1) & m & \Gamma K \cdot (n-2)+1(0,0) & m \\ m & \Gamma K \cdot (n-2)+1(1,0) & m & \Gamma K \cdot (n-2)+1(0,1) \\ m & \Gamma K \cdot (n-2)+1(0,1) & m & \Gamma K \cdot (n-2)+1(1,0) \end{bmatrix} \otimes$$

$$\begin{bmatrix} \Gamma K \cdot (n-2)(0,0) & m & \Gamma K \cdot (n-2)(1,1) & m \\ \Gamma K \cdot (n-2)(1,1) & m & \Gamma K \cdot (n-2)(0,0) & m \\ m & \Gamma K \cdot (n-2)(1,0) & m & \Gamma K \cdot (n-2)(0,1) \\ m & \Gamma K \cdot (n-2)(0,1) & m & \Gamma K \cdot (n-2)(1,0) \end{bmatrix}$$

$$= \begin{bmatrix} \{\Gamma K \cdot (n-2)+1(0,0) \otimes \Gamma K \cdot (n-2)(0,0)\} & \{\Gamma K \cdot (n-2)+1(1,1) \otimes \Gamma K \cdot (n-2)(1,0)\} \\ \{\Gamma K \cdot (n-2)+1(1,1) \otimes \Gamma K \cdot (n-2)(0,0)\} & \{\Gamma K \cdot (n-2)+1(0,0) \otimes \Gamma K \cdot (n-2)(1,0)\} \\ \{\Gamma K \cdot (n-2)+1(1,0) \otimes \Gamma K \cdot (n-2)(1,1)\} & \{\Gamma K \cdot (n-2)+1(0,1) \otimes \Gamma K \cdot (n-2)(0,1)\} \\ \{\Gamma K \cdot (n-2)+1(0,1) \otimes \Gamma K \cdot (n-2)(1,1)\} & \{\Gamma K \cdot (n-2)+1(1,0) \otimes \Gamma K \cdot (n-2)(0,1)\} \end{bmatrix}$$

$$\begin{bmatrix} \{\Gamma K \cdot (n-2)+1(0,0) \otimes \Gamma K \cdot (n-2)(1,1)\} & \{\Gamma K \cdot (n-2)+1(1,1) \otimes \Gamma K \cdot (n-2)(0,1)\} \\ \{\Gamma K \cdot (n-2)+1(1,1) \otimes \Gamma K \cdot (n-2)(1,1)\} & \{\Gamma K \cdot (n-2)+1(0,0) \otimes \Gamma K \cdot (n-2)(0,1)\} \\ \{\Gamma K \cdot (n-2)+1(1,0) \otimes \Gamma K \cdot (n-2)(0,0)\} & \{\Gamma K \cdot (n-2)+1(0,1) \otimes \Gamma K \cdot (n-2)(1,0)\} \\ \{\Gamma K \cdot (n-2)+1(0,1) \otimes \Gamma K \cdot (n-2)(0,0)\} & \{\Gamma K \cdot (n-2)+1(1,0) \otimes \Gamma K \cdot (n-2)(1,0)\} \end{bmatrix}$$

If this equation is written into $$\begin{bmatrix} a11 & a12 & a13 & a14 \\ a21 & a22 & a23 & a24 \\ a31 & a32 & a33 & a34 \\ a41 & a42 & a43 & a44 \end{bmatrix} \quad (38)$$

for example, the uppermost portion in FIG. 3 corresponds to $$a11 = \{\Gamma K \cdot (n-2)+1(0,0) \otimes \Gamma K \cdot (n-2)(0,0)\} \quad (39)$$

FIG. 3 and the equation correspond to each other in such a manner that each adder in FIG. 3

$$\oplus \quad (40)$$

is replaced with $$\otimes \quad (41)$$

In addition, the following is a relationship with the vector expression in FIG. 3:

$$A1 = [a11 \quad a12 \quad a13 \quad a14] \quad (42)$$

$$A2 = [a21 \quad a22 \quad a23 \quad a24]$$

$$A3 = [a31 \quad a32 \quad a33 \quad a34]$$

$$A4 = [a41 \quad a42 \quad a43 \quad a44]$$

Figure 4:
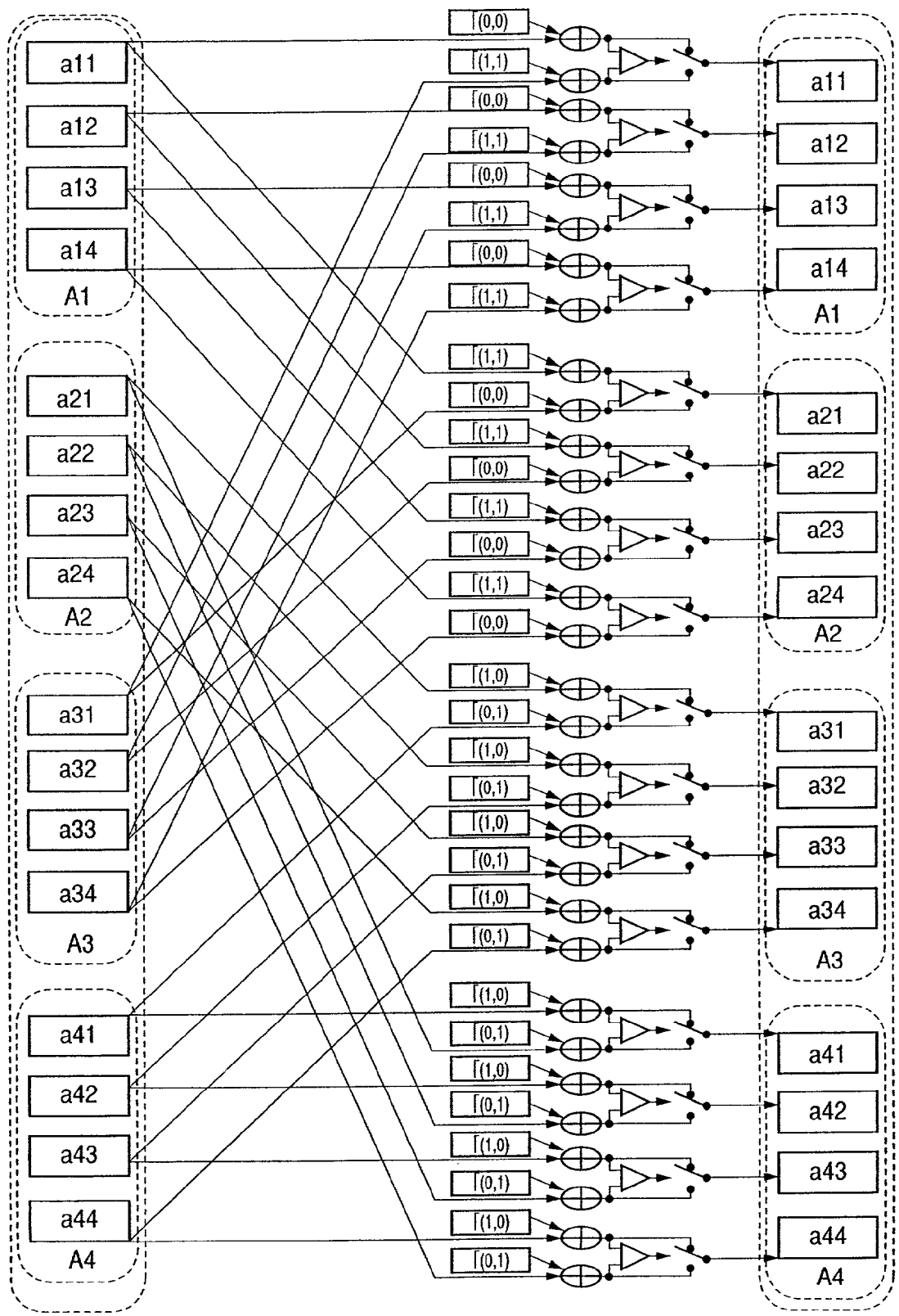
FIG. 4 is a block diagram showing an example of computation at the next (second) and subsequent stages, which is performed by an ACS computation means having a trellis structure constituted by parallel components, in ACS computation constituted by a plurality of stages of cascade connections and using gamma metrics for alpha metric computation as inputs.

The above relationship holds for A2, A3, and A4. The result obtained in this manner is input to an ACS computation means 202 having a trellis structure constituted by parallel components at the second and subsequent stages in FIG. 2. This embodiment includes one stage of ACS computation means having a trellis structure constituted by parallel components. This is because, K=3. If K is larger than 3, a plurality of stages of ACS computation means are used. FIG. 4 shows the detailed arrangement of an ACS computation means having a trellis structure constituted by parallel components. The operation in FIG. 4 corresponds to $$\Gamma \otimes \begin{bmatrix} A1 \\ A2 \\ A3 \\ A4 \end{bmatrix} = \begin{bmatrix} \Gamma(0,0) & m & \Gamma(1,1) & m \\ \Gamma(1,1) & m & \Gamma(0,0) & m \\ m & \Gamma(1,0) & m & \Gamma(0,1) \\ m & \Gamma(0,1) & m & \Gamma(1,0) \end{bmatrix} \otimes$$

-continued $$\begin{bmatrix} a11 & a12 & a13 & a14 \\ a21 & a22 & a23 & a24 \\ a31 & a32 & a33 & a34 \\ a41 & a42 & a43 & a44 \end{bmatrix}$$

$$= \begin{bmatrix} \{\Gamma(0,0) \otimes a11\} \oplus \{\Gamma(1,1) \otimes a31\} & \{\Gamma(0,0) \otimes a12\} \oplus \{\Gamma(1,1) \otimes a32\} \\ \{\Gamma(1,1) \otimes a11\} \oplus \{\Gamma(0,0) \otimes a31\} & \{\Gamma(1,1) \otimes a12\} \oplus \{\Gamma(0,0) \otimes a32\} \\ \{\Gamma(1,0) \otimes a21\} \oplus \{\Gamma(0,1) \otimes a41\} & \{\Gamma(1,0) \otimes a22\} \oplus \{\Gamma(0,1) \otimes a42\} \\ \{\Gamma(0,1) \otimes a21\} \oplus \{\Gamma(1,0) \otimes a41\} & \{\Gamma(0,1) \otimes a22\} \oplus \{\Gamma(1,0) \otimes a42\} \end{bmatrix}$$
$$\begin{matrix} \{\Gamma(0,0) \otimes a13\} \oplus \{\Gamma(1,1) \otimes a33\} & \{\Gamma(0,0) \otimes a14\} \oplus \{\Gamma(1,1) \otimes a34\} \\ \{\Gamma(1,1) \otimes a13\} \oplus \{\Gamma(0,0) \otimes a33\} & \{\Gamma(1,1) \otimes a14\} \oplus \{\Gamma(0,0) \otimes a34\} \\ \{\Gamma(1,0) \otimes a23\} \oplus \{\Gamma(0,1) \otimes a43\} & \{\Gamma(1,0) \otimes a24\} \oplus \{\Gamma(0,1) \otimes a44\} \\ \{\Gamma(0,1) \otimes a23\} \oplus \{\Gamma(1,0) \otimes a43\} & \{\Gamma(0,1) \otimes a24\} \oplus \{\Gamma(1,0) \otimes a44\} \end{matrix}$$
(43)

If this is expressed as $$\begin{bmatrix} a11 & a12 & a13 & a14 \\ a21 & a22 & a23 & a24 \\ a31 & a32 & a33 & a34 \\ a41 & a42 & a43 & a44 \end{bmatrix} \quad (44)$$

then, for example, the uppermost computation in FIG. 4 corresponds to $$\alpha 11 = \{\Gamma(0,0) \otimes \alpha 11\} \oplus \{\Gamma(1,1) \otimes \alpha 31\} \quad (45)$$

FIG. 4 and the equation correspond to each other in such a manner that each adder in FIG. 4

$$\oplus \quad (46)$$

is replaced with $$\otimes \quad (47)$$

In addition, each 2-input comparing/selecting circuit is replaced with $$\oplus \quad (48)$$

which computes two terms of the equation.

In addition, the following is a relationship with the vector expression in FIG. 2:

$$A1(n-1) = [a11 \quad a12 \quad a13 \quad a14] \quad (49)$$
$$A2(n-1) = [a21 \quad a22 \quad a23 \quad a24]$$
$$A3(n-1) = [a31 \quad a32 \quad a33 \quad a34]$$
$$A4(n-1) = [a41 \quad a42 \quad a43 \quad a44]$$

The above relationship holds for A2(n−1), A3(n−1), and A4(n−1). The result obtained in this manner is the output in FIG. 2. That is, the overall operation in FIG. 2 corresponds to the following computation:

$$\{\Gamma K \cdot (n-2) + \bar{3} \otimes \{\Gamma K \cdot (n-2) + \bar{1} \otimes \Gamma K \cdot (n-2)\}\} = \quad (50)$$

$$\begin{bmatrix} a11 & a12 & a13 & a14 \\ a21 & a22 & a23 & a24 \\ a31 & a32 & a33 & a34 \\ a41 & a42 & a43 & a44 \end{bmatrix}$$

In this case, K=3. Obviously, however, the number of stages can be easily increased by increasing the number of ACS computation means 202 having a trellis structure constituted by parallel components in the form of cascade connection.

A method of supplying gamma metrics to such an arrangement is indicated by reference numeral 203 in FIG. 2. As shown in FIG. 2, gamma metrics are supplied by pipeline processing for each stage. At the first stage, gamma metrics are concurrently supplied because only additions are required as shown in FIG. 2. At the subsequent stages, gamma metrics are supplied with a delay of one step for each stage, thereby allowing the process to smoothly proceed.

As described above, alpha metric updating every K stages and storing operation as shown in FIG. 1 and the gamma metric computation means having the ACS cascade configuration which is used to realize alpha metric updating every K stages can increase the operation speed by K times and reduce the alpha metric memory capacity to 1/K.

The above relationship can be expressed by the following matrix:

$$\bar{\alpha}[K \cdot (n-1)] = \Gamma K \cdot (n-2) + \bar{2} \otimes \{\Gamma K \cdot (n-2) + \bar{1} \otimes \quad (51)$$
$$\{\Gamma K \cdot (n-2) \otimes \bar{\alpha}[K \cdot (n-2)]\}\}$$
$$= \{\Gamma K \cdot (n-2) + \bar{2} \otimes \{\Gamma K \cdot (n-2) + \bar{1} \otimes$$
$$\Gamma K \cdot (n-2)\}\} \otimes \bar{\alpha}[K \cdot (n-2)]$$
$$= \begin{bmatrix} A1(n-1) \\ A2(n-1) \\ A3(n-1) \\ A4(n-1) \end{bmatrix} \otimes \bar{\alpha}[K \cdot (n-2)]$$

The above description is about alpha metrics. Obviously, however, the present invention can be applied to beta metrics replacing alpha metrics.

An update process for beta metrics will be described next with reference to FIG. 5.

Forward computation processing is performed for alpha metrics. In contrast to this, backward computation processing is performed for beta metrics. Therefore, a matrix corresponding to a trellis diagram is given by $$\overline{\Gamma n} = \begin{bmatrix} \Gamma n(0,0) & \Gamma n(1,1) & m & m \\ m & m & \Gamma n(1,0) & \Gamma n(0,1) \\ \Gamma n(1,1) & \Gamma n(0,0) & m & m \\ m & m & \Gamma n(0,1) & \Gamma n(1,0) \end{bmatrix} \quad (52)$$

In addition, since updating is performed by backward computation processing, if K=3, gamma metrics are computed as follows:

$$\{\Gamma K \cdot (n+1) - 3 \otimes \{\Gamma K \cdot (n+1) - 2 \otimes \Gamma K \cdot (n+1) - 1\}\} = \quad (53)$$

$$\begin{bmatrix} a11 & a12 & a13 & a14 \\ a21 & a22 & a23 & a24 \\ a31 & a32 & a33 & a34 \\ a41 & a42 & a43 & a44 \end{bmatrix}$$

Similar to alpha metrics, if $$\overline{\beta[K \cdot (n+1)]} = \begin{bmatrix} \beta 00[K \cdot (n+1)] \\ \beta 01[K \cdot (n+1)] \\ \beta 10[K \cdot (n+1)] \\ \beta 11[K \cdot (n+1)] \end{bmatrix} \quad (54)$$

then, $$\overline{\beta[K \cdot n]} = \begin{bmatrix} a11 & a12 & a13 & a14 \\ a21 & a22 & a23 & a24 \\ a31 & a32 & a33 & a34 \\ a41 & a42 & a43 & a44 \end{bmatrix} \otimes \begin{bmatrix} \beta 00[K \cdot (n+1)] \\ \beta 01[K \cdot (n+1)] \\ \beta 10[K \cdot (n+1)] \\ \beta 11[K \cdot (n+1)] \end{bmatrix} \quad (55)$$

$$= \begin{bmatrix} \{a11 \otimes \beta 00[K \cdot (n+1)]\} \oplus \{a12 \otimes \beta 01[K \cdot (n+1)]\} \oplus \\ \{a21 \otimes \beta 00[K \cdot (n+1)]\} \oplus \{a22 \otimes \beta 01[K \cdot (n+1)]\} \oplus \\ \{a31 \otimes \beta 00[K \cdot (n+1)]\} \oplus \{a32 \otimes \beta 01[K \cdot (n+1)]\} \oplus \\ \{a41 \otimes \beta 00[K \cdot (n+1)]\} \oplus \{a42 \otimes \beta 01[K \cdot (n+1)]\} \oplus \\ \{a13 \otimes \beta 10[K \cdot (n+1)]\} \oplus \{a14 \otimes \beta 11[K \cdot (n+1)]\} \\ \{a23 \otimes \beta 10[K \cdot (n+1)]\} \oplus \{a24 \otimes \beta 11[K \cdot (n+1)]\} \\ \{a33 \otimes \beta 10[K \cdot (n+1)]\} \oplus \{a34 \otimes \beta 11[K \cdot (n+1)]\} \\ \{a43 \otimes \beta 10[K \cdot (n+1)]\} \oplus \{a44 \otimes \beta 11[K \cdot (n+1)]\} \end{bmatrix}$$

Figure 5:
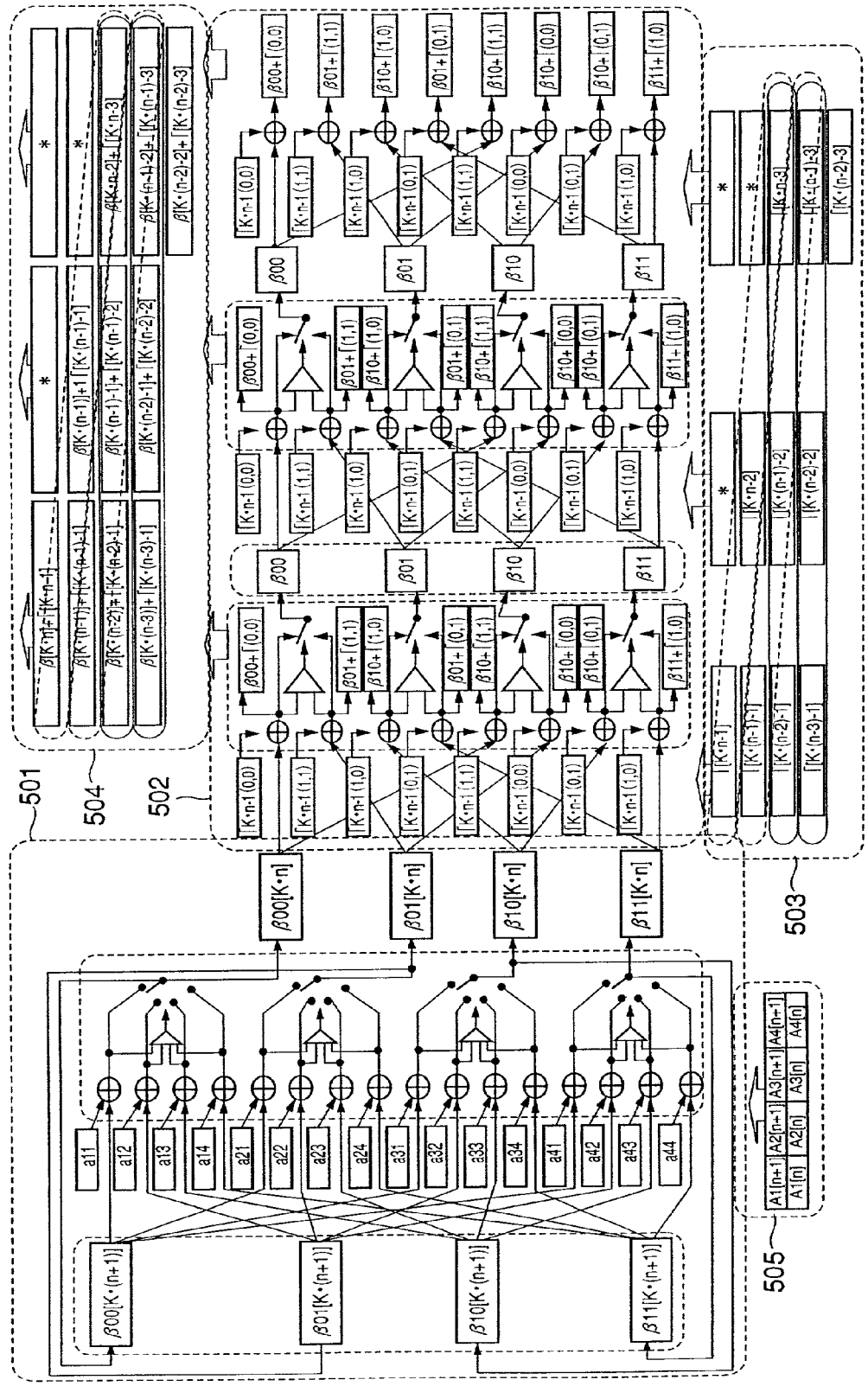
FIG. 5 is a block diagram showing an embodiment in which beta metric computation is performed by using the high-speed turbo decoder according to the present invention.

A beta metric updating circuit 501 in FIG. 5 corresponds to the above computation. Note that $$\oplus \quad (56)$$

in FIG. 5 represents general addition but differs from comparison/selection in the above semiring. As shown in FIG. 5, beta metrics are updated every K=3 stages, and the computation results are input to an ACS computation processing section 502 constituted by a plurality of stages of cascade connections. This ACS computation is equivalent to a plurality of stages of processing used for general beta metric updating. For example, such a method is disclosed in Japanese Patent Application No. 11-192467. Therefore, backward computation processing is performed in a cascade fashion by using $$\overline{\beta[K \cdot n]} = \begin{bmatrix} \beta 00[K \cdot n] \\ \beta 01[K \cdot n] \\ \beta 10[K \cdot n] \\ \beta 11[K \cdot n] \end{bmatrix} \quad (57)$$

as an initial value. Gamma metric supply 503 required for backward computation processing is performed by pipeline processing for each stage, and gamma metrics are supplied with a delay of one step for each stage (in reverse in terms of time owing to backward computation), thereby allowing the processing to smoothly proceed. As a result of this operation, a beta metric/gamma metric addition result 504 can be obtained from each stage of the ACS computation processing section 502 constituted by cascade connections. Referring to FIG. 5, the results are expressed in vectors. The following is an example of an expression corresponding to the vector expression:

$$\beta[K \cdot n] + \Gamma[K \cdot n - 1] = \begin{bmatrix} \beta 00[K \cdot n] + \Gamma K \cdot n - 1(0,0) \\ \beta 00[K \cdot n] + \Gamma K \cdot n - 1(1,1) \\ \beta 01[K \cdot n] + \Gamma K \cdot n - 1(1,1) \\ \beta 01[K \cdot n] + \Gamma K \cdot n - 1(0,0) \\ \beta 10[K \cdot n] + \Gamma K \cdot n - 1(1,0) \\ \beta 10[K \cdot n] + \Gamma K \cdot n - 1(0,1) \\ \beta 11[K \cdot n] + \Gamma K \cdot n - 1(0,1) \\ \beta 11[K \cdot n] + \Gamma K \cdot n - 1(1,0) \end{bmatrix} \quad (58)$$

The beta metric/gamma metric addition result 504 from each stage of the ACS computation processing section 502 constituted by cascade connections is delayed by one step for each stage. In this case, therefore, three values are concurrently output without cessation. This increases the processing speed in a general method disclosed in, for example, Japanese Patent Application No. 11-192467 by three times. Obviously, the processing speed can be arbitrarily increased by designing the above arrangement to increase the value of K.

Gamma metric computation results 505 in FIG. 5 have the same contents as those described in the case of alpha metrics, and hence a description thereof will be omitted. However, this operation differs from that for alpha metrics in that beta metrics are updated in the direction in which they decrease in value unlike alpha metrics which are updated in the direction in which they increase in value.

Figure 6:
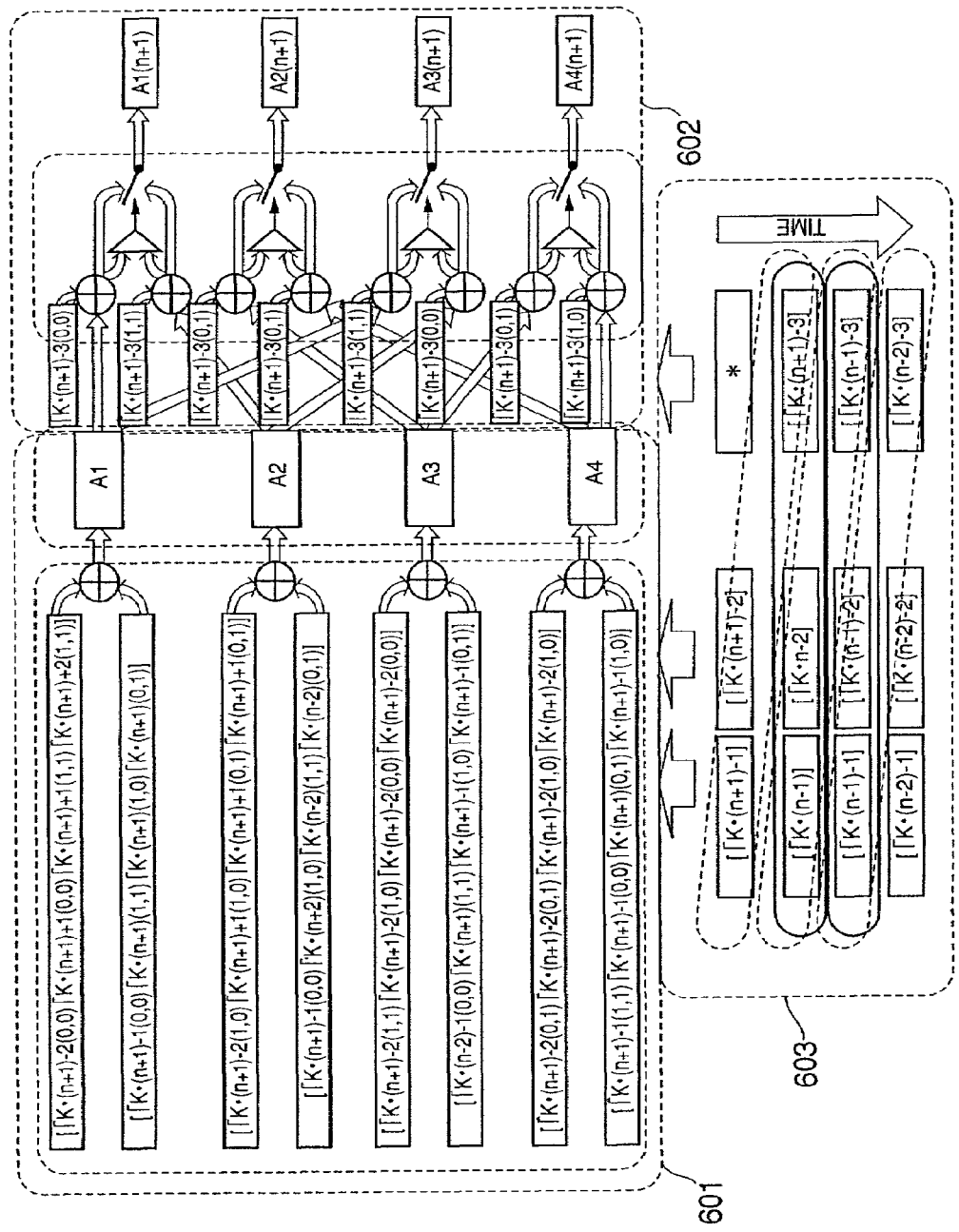
FIG. 6 is a block diagram showing an example of ACS computation constituted by a plurality of stages of cascade connections and using gamma metrics for beta metric computation as inputs.
Figure 7:
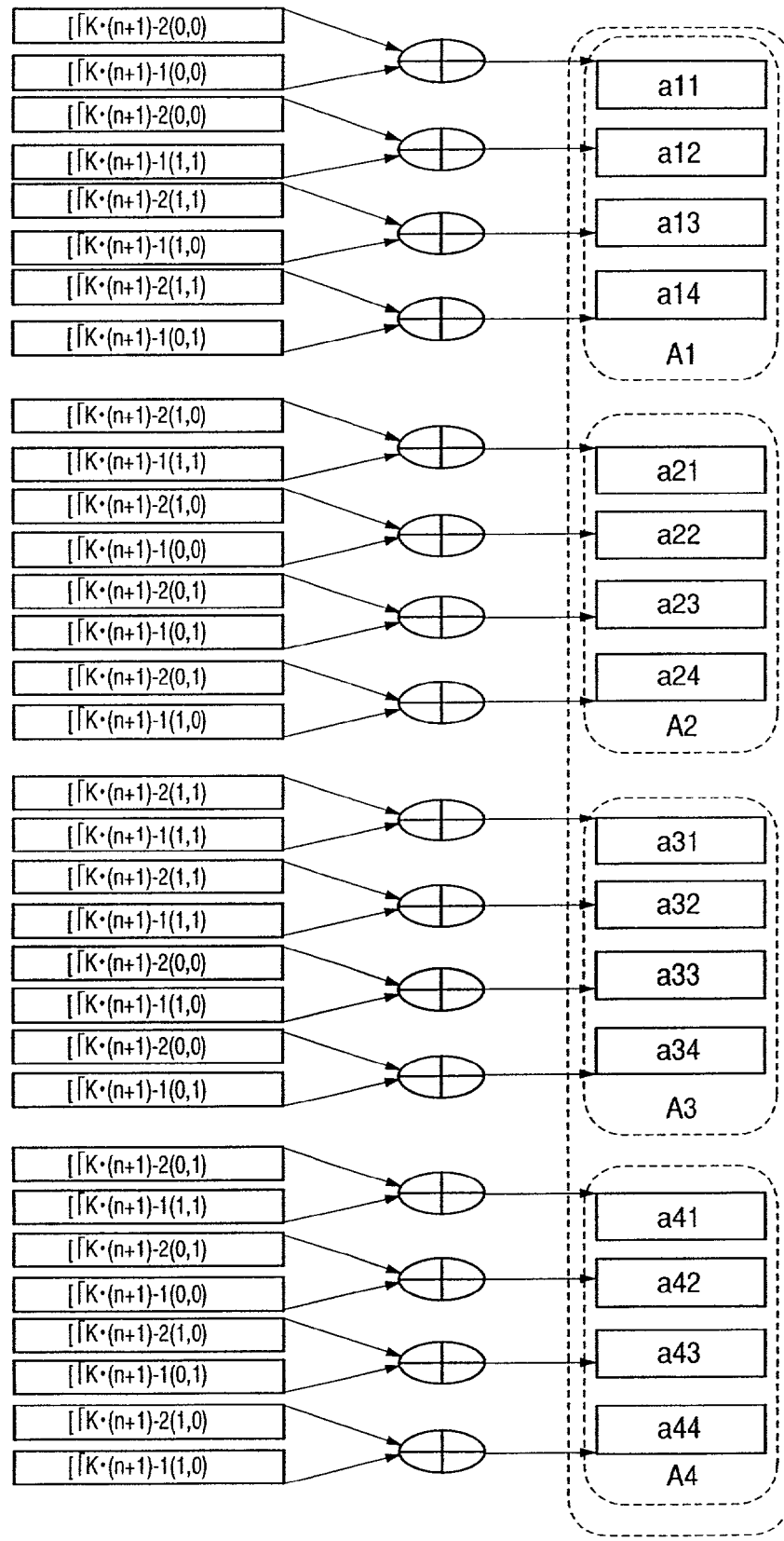
FIG. 7 is a block diagram showing an example of computation at the first stage in ACS computation constituted by a plurality of stages of cascade connections and using gamma metrics for beta metric computation as inputs.

FIG. 6 shows a means for obtaining the gamma metric computation results 505. Referring to FIG. 6, a first stage 601 represents addition of gamma metrics. FIG. 7 shows the detailed arrangement of this stage. Although the stage can be configured in the same manner as for alpha metrics, the arrangement for gamma metrics differs from that for alpha metrics in the direction of steps and trellis based on backward computation, and is expressed as follows:

For example, the uppermost portion in FIG. 7 corresponds to $$\alpha 11 = \{\Gamma K \cdot (n+1) - 2(0,0) \otimes \Gamma K \cdot (n+1) - 1(0,0)\} \quad (61)$$

FIG. 7 and this equation correspond to each other in such a manner that each adder in FIG. 7

$$\oplus \quad (62)$$

is replaced with $$\otimes \quad (63)$$

The same applies to the remaining portions.

The results obtained in this manner are input to an ACS computation means 602 having a trellis structure which is constituted by parallel components at the second and subsequent stages in FIG. 6. This embodiment includes only one ACS computation means having a trellis structure constituted by parallel components. This is because K=3. If K is larger than 3, a plurality of ACS computation means are $$\Gamma K \cdot (n+1) - 2 \otimes \Gamma K \cdot (n+1) - 1 \quad (59)$$

$$= \begin{bmatrix} \Gamma K \cdot (n+1) - 2(0,0) & \Gamma K \cdot (n+1) - 2(1,1) & m & m \\ m & m & \Gamma K \cdot (n+1) - 2(1,0) & \Gamma K \cdot (n+1) - 2(0,1) \\ \Gamma K \cdot (n+1) - 2(1,1) & \Gamma K \cdot (n+1) - 2(0,0) & m & m \\ m & m & \Gamma K \cdot (n+1) - 2(0,1) & \Gamma K \cdot (n+1) - 2(1,0) \end{bmatrix} \otimes$$

$$\begin{bmatrix} \Gamma K \cdot (n+1) - 1(0,0) & \Gamma K \cdot (n+1) - 1(1,1) & m & m \\ m & m & \Gamma K \cdot (n+1) - 1(1,0) & \Gamma K \cdot (n+1) - 1(0,1) \\ \Gamma K \cdot (n+1) - 1(1,1) & \Gamma K \cdot (n+1) - 1(0,0) & m & m \\ m & m & \Gamma K \cdot (n+1) - 1(0,1) & \Gamma K \cdot (n+1) - 1(1,0) \end{bmatrix}$$

$$= \begin{bmatrix} \{\Gamma K \cdot (n+1) - 2(0,0) \otimes \Gamma K \cdot (n+1) - 1(0,0)\} & \{\Gamma K \cdot (n+1) - 2(0,0) \otimes \Gamma K \cdot (n+1) - 1(1,1)\} \\ \{\Gamma K \cdot (n+1) - 2(1,1) \otimes \Gamma K \cdot (n+1) - 1(0,0)\} & \{\Gamma K \cdot (n+1) - 2(1,0) \otimes \Gamma K \cdot (n+1) - 1(0,0)\} \\ \{\Gamma K \cdot (n+1) - 2(0,0) \otimes \Gamma K \cdot (n+1) - 1(1,1)\} & \{\Gamma K \cdot (n+1) - 2(1,1) \otimes \Gamma K \cdot (n+1) - 1(1,1)\} \\ \{\Gamma K \cdot (n+1) - 2(0,1) \otimes \Gamma K \cdot (n+1) - 1(1,1)\} & \{\Gamma K \cdot (n+1) - 2(0,1) \otimes \Gamma K \cdot (n+1) - 1(0,0)\} \end{bmatrix}$$

$$\begin{bmatrix} \{\Gamma K \cdot (n+1) - 2(1,1) \otimes \Gamma K \cdot (n+1) - 1(1,0)\} & \{\Gamma K \cdot (n+1) - 2(1,1) \otimes \Gamma K \cdot (n+1) - 1(0,1)\} \\ \{\Gamma K \cdot (n+1) - 2(0,1) \otimes \Gamma K \cdot (n+1) - 1(0,1)\} & \{\Gamma K \cdot (n+1) - 2(0,0) \otimes \Gamma K \cdot (n+1) - 1(1,0)\} \\ \{\Gamma K \cdot (n+1) - 2(0,0) \otimes \Gamma K \cdot (n+1) - 1(1,0)\} & \{\Gamma K \cdot (n+1) - 2(0,0) \otimes \Gamma K \cdot (n+1) - 1(0,1)\} \\ \{\Gamma K \cdot (n+1) - 2(1,0) \otimes \Gamma K \cdot (n+1) - 1(0,1)\} & \{\Gamma K \cdot (n+1) - 2(1,0) \otimes \Gamma K \cdot (n+1) - 1(1,0)\} \end{bmatrix}$$

Figure 8:
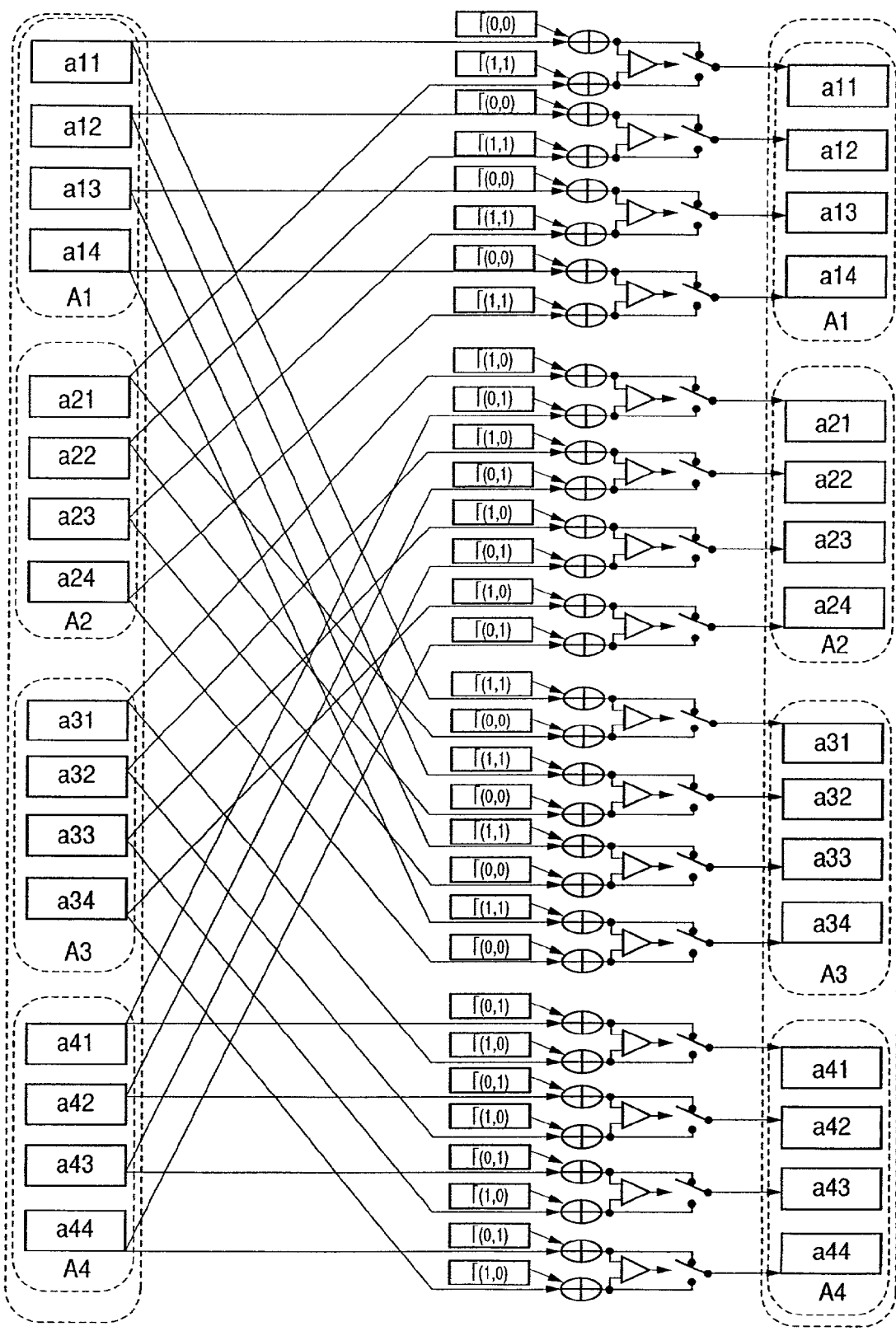
FIG. 8 is a block diagram showing an example of computation at the next (second) and subsequent stages, which is performed by an ACS computation means having a trellis structure constituted by parallel components, in ACS computation constituted by a plurality of stages of cascade connections and using gamma metrics for beta metric computation as inputs.

This expression is modified into $$\begin{bmatrix} a11 & a12 & a13 & a14 \\ a21 & a22 & a23 & a24 \\ a31 & a32 & a33 & a34 \\ a41 & a42 & a43 & a44 \end{bmatrix} \quad (60)$$

required. FIG. 8 shows the detailed arrangement of the ACS computation means having a trellis structure constituted by parallel components.

According to the operation in FIG. 8, backward computation processing is performed for beta metrics, and hence a matrix corresponding to a trellis diagram differs from that for alpha metrics and is expressed as follows:

$$\Gamma \otimes \begin{bmatrix} A1 \\ A2 \\ A3 \\ A4 \end{bmatrix} = \begin{bmatrix} \Gamma(0,0) & \Gamma(1,1) & m & m \\ m & m & \Gamma(1,0) & \Gamma(1,0) \\ \Gamma(1,1) & \Gamma(0,0) & m & m \\ m & m & \Gamma(0,1) & \Gamma(1,0) \end{bmatrix} \otimes \begin{bmatrix} a11 & a12 & a13 & a14 \\ a21 & a22 & a23 & a24 \\ a31 & a32 & a33 & a34 \\ a41 & a42 & a43 & a44 \end{bmatrix} \quad (64)$$

$$\begin{bmatrix} \{\Gamma(0,0) \otimes a11\} \oplus \{\Gamma(1,1) \otimes a21\} & \{\Gamma(0,0) \otimes a12\} \oplus \{\Gamma(1,1) \otimes a22\} \\ \{\Gamma(1,0) \otimes a31\} \oplus \{\Gamma(0,1) \otimes a41\} & \{\Gamma(1,0) \otimes a32\} \oplus \{\Gamma(0,1) \otimes a42\} \\ \{\Gamma(1,1) \otimes a11\} \oplus \{\Gamma(0,0) \otimes a21\} & \{\Gamma(1,1) \otimes a12\} \oplus \{\Gamma(0,0) \otimes a22\} \\ \{\Gamma(0,1) \otimes a31\} \oplus \{\Gamma(1,0) \otimes a41\} & \{\Gamma(0,1) \otimes a32\} \oplus \{\Gamma(1,0) \otimes a42\} \end{bmatrix}$$

-continued
$$\begin{bmatrix} \{\Gamma(0,0) \otimes a13\} \oplus \{\Gamma(1,1) \otimes a23\} & \{\Gamma(0,0) \otimes a14\} \oplus \{\Gamma(1,1) \otimes a24\} \\ \{\Gamma(1,0) \otimes a33\} \oplus \{\Gamma(0,1) \otimes a43\} & \{\Gamma(1,0) \otimes a34\} \oplus \{\Gamma(0,1) \otimes a44\} \\ \{\Gamma(1,1) \otimes a13\} \oplus \{\Gamma(0,0) \otimes a23\} & \{\Gamma(1,1) \otimes a14\} \oplus \{\Gamma(0,0) \otimes a24\} \\ \{\Gamma(0,1) \otimes a33\} \oplus \{\Gamma(1,0) \otimes a43\} & \{\Gamma(0,1) \otimes a34\} \oplus \{\Gamma(1,0) \otimes a44\} \end{bmatrix}$$

This expression is modified into $$\begin{bmatrix} a11 & a12 & a13 & a14 \\ a21 & a22 & a23 & a24 \\ a31 & a32 & a33 & a34 \\ a41 & a42 & a43 & a44 \end{bmatrix} \quad (65)$$

For example, computation in the uppermost portion in FIG. 8 corresponds to $$\alpha 11 = \{\Gamma(0,0) \otimes \alpha 11\} \oplus \{\Gamma(1,1) \otimes \alpha 21\} \quad (66)$$

FIG. 8 and this equation correspond to each other in such a manner that each adder in FIG. 8

$$\oplus \quad (67)$$

is replaced with $$\otimes \quad (68)$$

In addition, each 2-input comparing/selecting circuit is replaced with $$\oplus \quad (69)$$

which computes two terms of the equation.

The same applies to the remaining portions. The result obtained in this manner is the output in FIG. 6. That is, the overall arrangement in FIG. 6 performs a computation corresponding to $$\left\{\overrightarrow{\Gamma K \cdot (n+1) - 3} \otimes \right. \quad (70)$$
$$\left. \left\{\overrightarrow{\Gamma K \cdot (n+1) - 2} \otimes \overrightarrow{\Gamma K + (n+1) - 1}\right\}\right\} = \begin{bmatrix} a11 & a12 & a13 & a14 \\ a21 & a22 & a23 & a24 \\ a31 & a32 & a33 & a34 \\ a41 & a42 & a43 & a44 \end{bmatrix}$$

In this case, K=3. Obviously, however, the number of stages can be easily increased by increasing the number of ACS computation means 602 having a trellis structure constituted by parallel components in the form of cascade connection.

A method of supplying gamma metrics to such an arrangement is indicated by reference numeral 603 in FIG. 6. As shown in FIG. 6, gamma metrics are supplied by pipeline processing for each stage. At the first stage, gamma metrics are concurrently supplied because only additions are required as shown in FIG. 2. At the subsequent stages, gamma metrics are supplied with a delay of one step for each stage, thereby allowing the process to smoothly proceed.

As described above, the operation speed can be increased by K times by beta metric updating for every K stages in FIG. 5, the addition result 504 on beta metrics, which are K times faster, and gamma metrics, and the gamma metric computation means having ACS cascade connections for updating beta metrics every K stages.

An update process for beta metrics is expressed in matrix as follows:

$$\overline{\beta}[K \cdot n] = \overrightarrow{\Gamma K \cdot (n+1) - 3} \otimes \left\{\overrightarrow{\Gamma K \cdot (n+1) - 2} \otimes \right. \quad (71)$$
$$\left.\left\{\overrightarrow{\Gamma K \cdot (n+1) - 1} \otimes \overline{\beta}[K \cdot (n+1)]\right\}\right\}$$
$$= \left\{\overrightarrow{\Gamma K \cdot (n+1) - 3} \otimes \left\{\overrightarrow{\Gamma K \cdot (n+1) - 2} \otimes \right.\right.$$
$$\left.\left.\overrightarrow{\Gamma K \cdot (n+1) - 1}\right\} \otimes \overline{\beta}[K \cdot (n+1)]\right.$$
$$= \begin{bmatrix} A1(n+1) \\ A2(n+1) \\ A3(n+1) \\ A4(n+1) \end{bmatrix} \otimes \overrightarrow{\beta}[K \cdot (n+1)]$$

where; $K = 3$

The above description is about beta metrics. Obviously, however, the present invention can be applied to alpha metrics replacing beta metrics.

A method of performing high-speed likelihood computation on the basis of the alpha and beta metrics for high-speed operation obtained in this manner will be described below.

Figure 9:
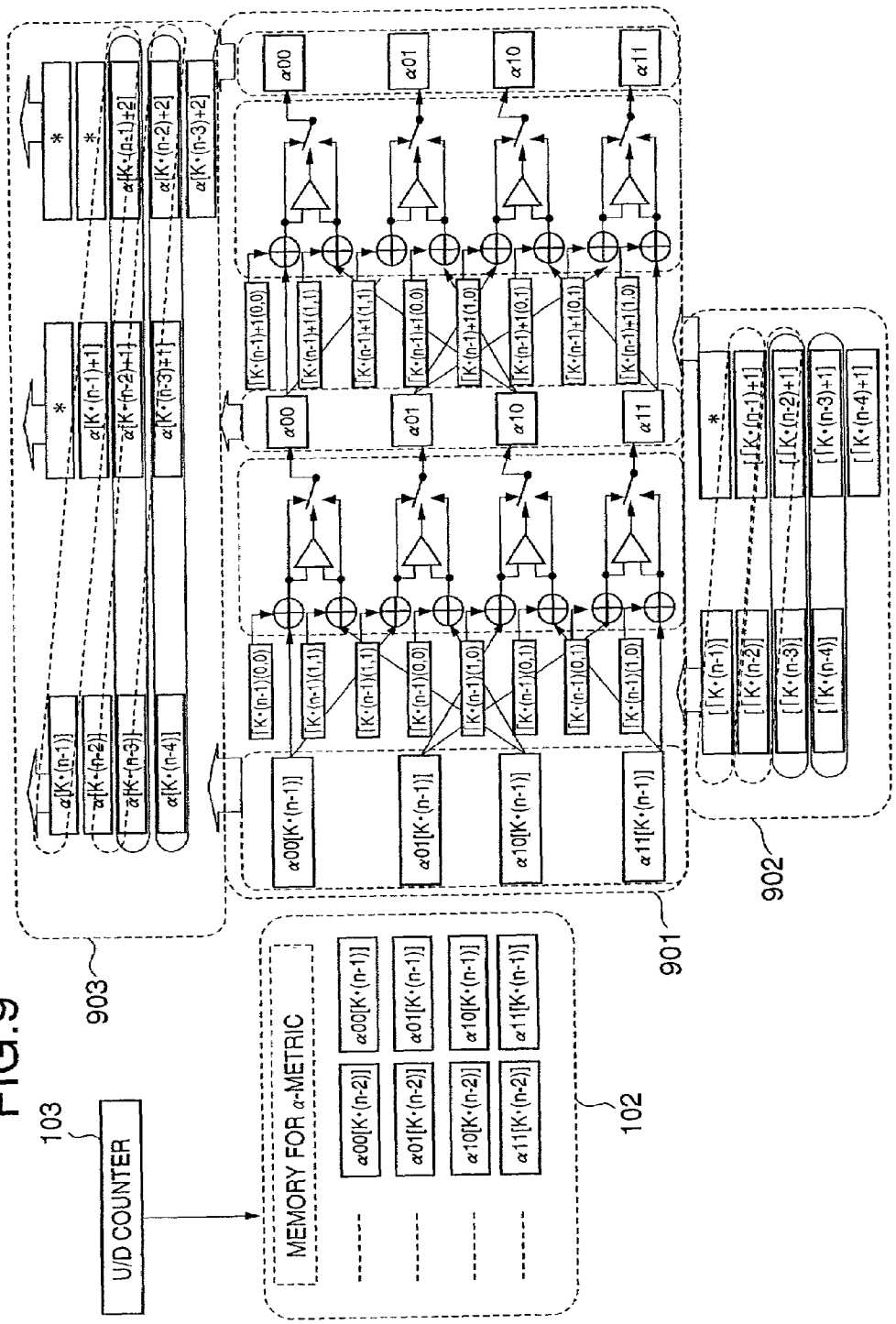
FIG. 9 is a block diagram showing an alpha metric reproducing circuit.

A means for quickly restoring alpha metrics from the alpha metric memory 102 which are stored every K stages in the above manner will be described first with reference to FIG. 9. For the sake of descriptive convenience, FIG. 9 also shows the alpha metric memory 102 and the U/D counter 103 for controlling the addresses in the memory, which have already been described above. This U/D counter 103 for controlling addresses increments the address by performing up-counting operation for every K stages in storing operation in FIG. 1. In the case shown in FIG. 9, this counter performs down-counting operating in read processing to decrement the address. Assume that the alpha metrics read out in this manner are represented by $\alpha 00[[K \cdot (n-1)]$, $\alpha 01[[K \cdot (n-1)]$, $\alpha 10[[K \cdot (n-1)]$, $\alpha 11[[K \cdot (n-1)]$. These readout alpha metrics are input to an ACS computation processing section 901 constituted by a plurality of stages of cascade connections. This ACS computation is equivalent to a plurality of stages of processing used for general alpha metric updating. For example, such a method is disclosed in Japanese Patent Application No. 11-1924667. Therefore, forward computation processing is performed in a cascade fashion by using $$\overrightarrow{\alpha[K \cdot (n-1)]} = \begin{bmatrix} \alpha 00[K \cdot (n-1)] \\ \alpha 01[K \cdot (n-1)] \\ \alpha 10[K \cdot (n-1)] \\ \alpha 11[K \cdot (n-1)] \end{bmatrix} \quad (72)$$

as an initial value. Gamma metric supply 902 required for forward computation processing is performed by pipeline processing for each stage, and gamma metrics are supplied with a delay of one step for each stage, thereby allowing the processing to smoothly proceed. Referring to FIG. 9, the results are expressed in vectors. The following is an example of an expression corresponding to the vector expression:

$$[\Gamma K \cdot (n-1)] = \begin{bmatrix} \Gamma K \cdot (n-1)(0,0) \\ \Gamma K \cdot (n-1)(0,1) \\ \Gamma K \cdot (n-1)(1,0) \\ \Gamma K \cdot (n-1)(1,1) \end{bmatrix} \quad (73)$$

In addition, gamma metrics are supplied with an advance of one step for each stage and a delay for every K stages. This operation is required to provide timing for backward processing of beta metrics in likelihood computation.

As a result of this operation, alpha metrics 903 can be obtained from each stage of the ACS computation processing section 901 constituted by cascade connections.

The alpha metrics 903 as output results are also output by pipeline processing and advanced step by step for every stage. In this case, therefore, three values are concurrently output without cessation. This increases the processing speed in a general method disclosed in, for example, Japanese Patent Application No. 11-192467 by three times. Obviously, the processing speed can be arbitrarily increased by designing the above arrangement to increase the value of K.

Figure 10:
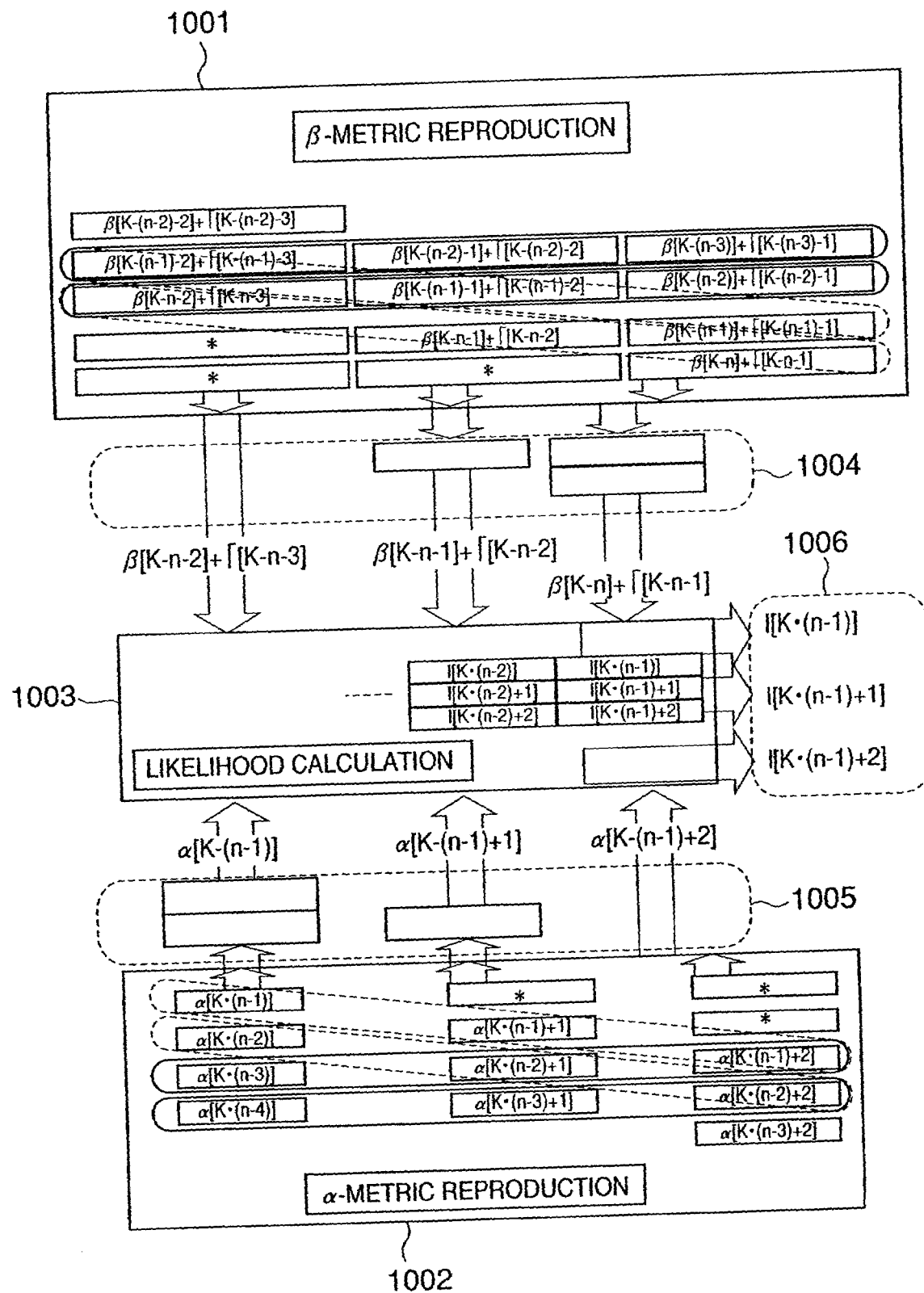
FIG. 10 is a block diagram showing a likelihood computation processing section.
Figure 11:
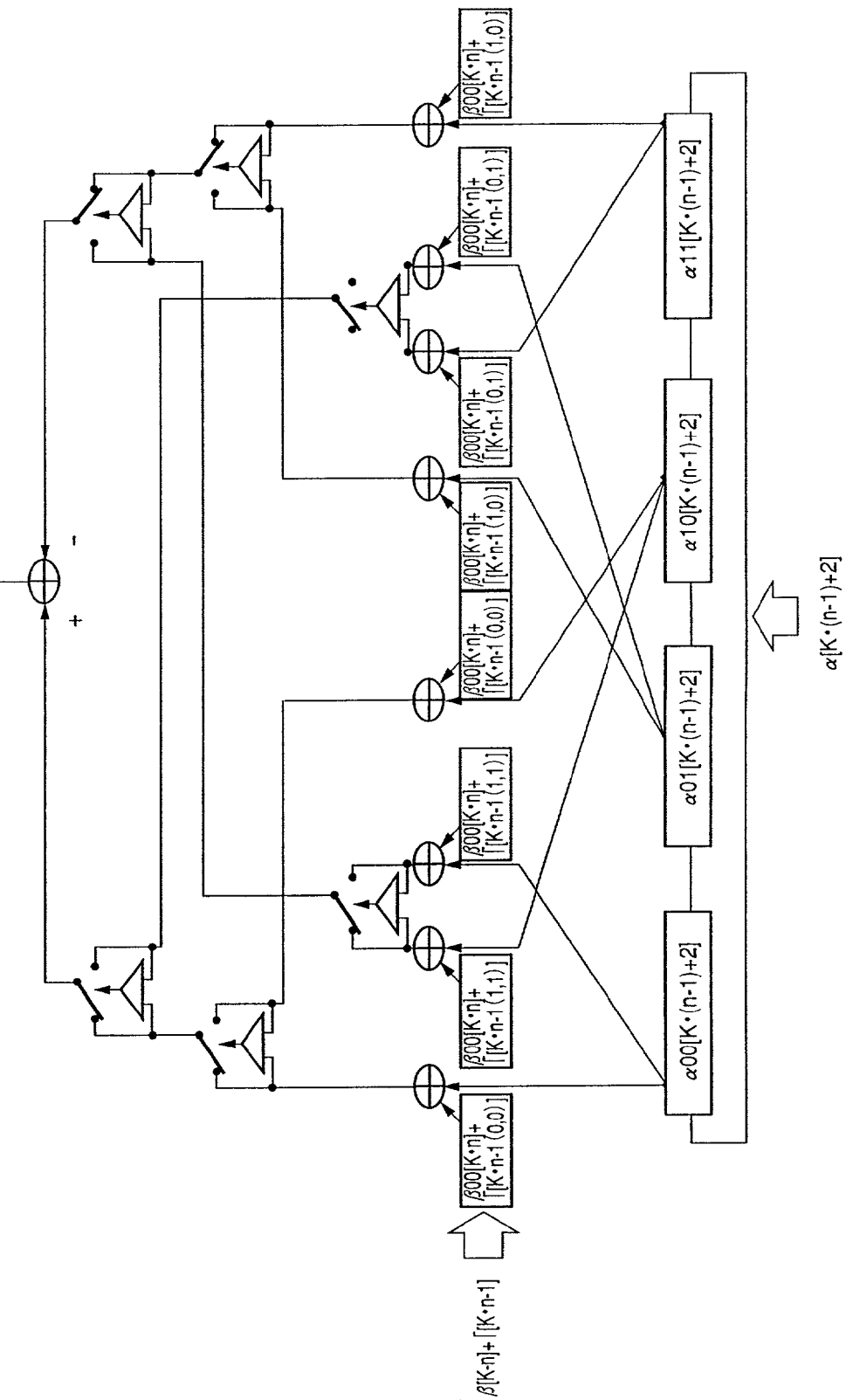
FIG. 11 is a block diagram showing a likelihood computation processing section.

FIG. 10 shows likelihood computation processing based on the alpha and beta metrics obtained in this manner. Referring to FIG. 10, reference numeral 1001 denotes processing for generating beta metric/gamma metric addition results as shown in FIG. 5; and 1002, a means for reproducing the alpha metrics in FIG. 9. Referring to FIG. 10, reference numeral 1003 denotes likelihood computation processing, in which the beta metric/gamma metric addition results and alpha metrics are supplied from the processing 1001 and means 1002, respectively, in K-parallel configurations through delay means 1004 and 1005. These delay means perform synchronization for processing required for likelihood computation, and K logarithmic likelihood ratios for the respective information bits can be simultaneously obtained. FIG. 11 shows likelihood computation processing, which is a general method disclosed in, for example, Japanese Patent Application No.-11-192467. In this embodiment, the processing 1003 is implemented by using K likelihood computation processes. Therefore, the processing speed can be increased by K times.

Figure 12:
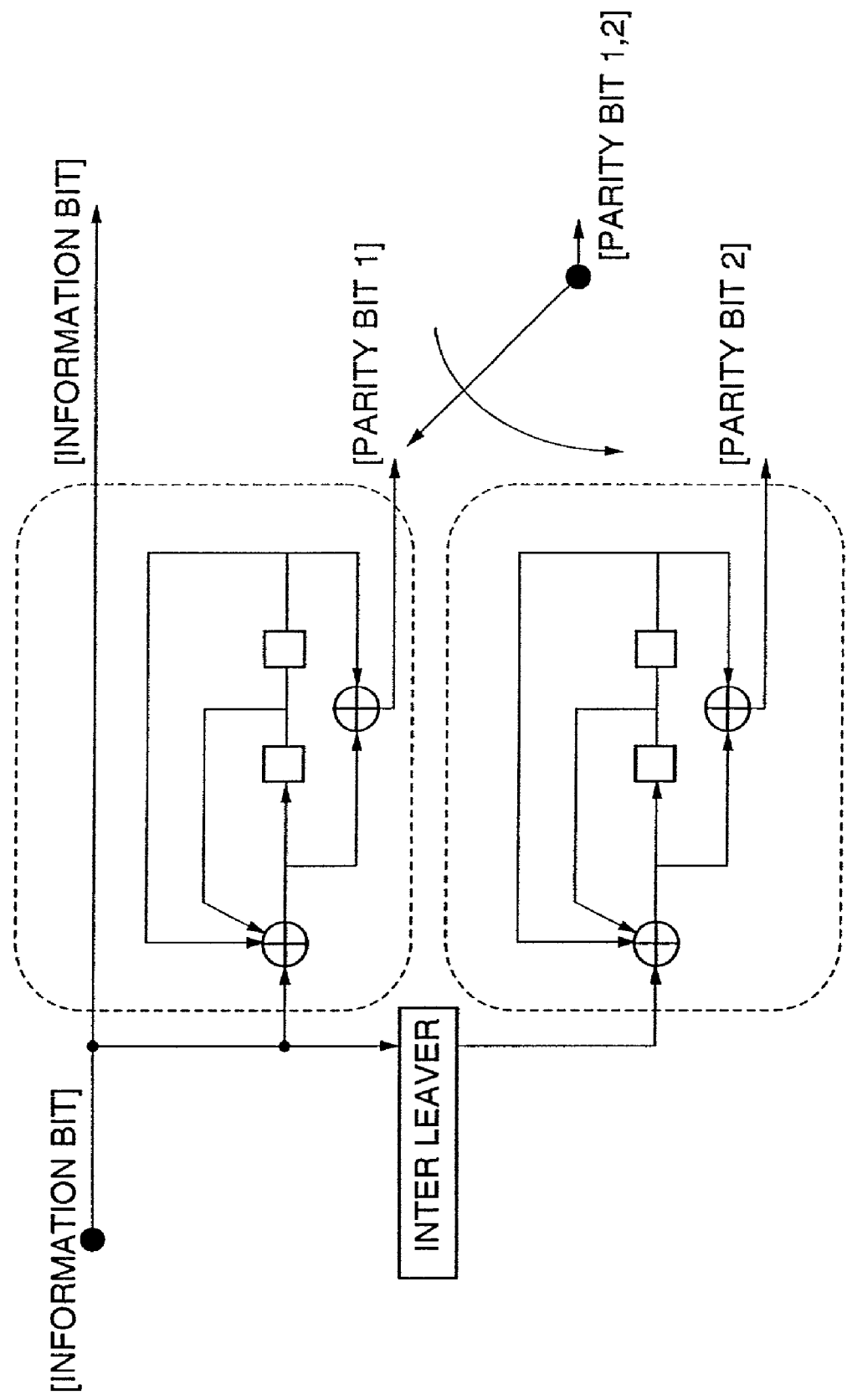
FIG. 12 is a block diagram showing parallel concatenation turbo coding.
Figure 13:
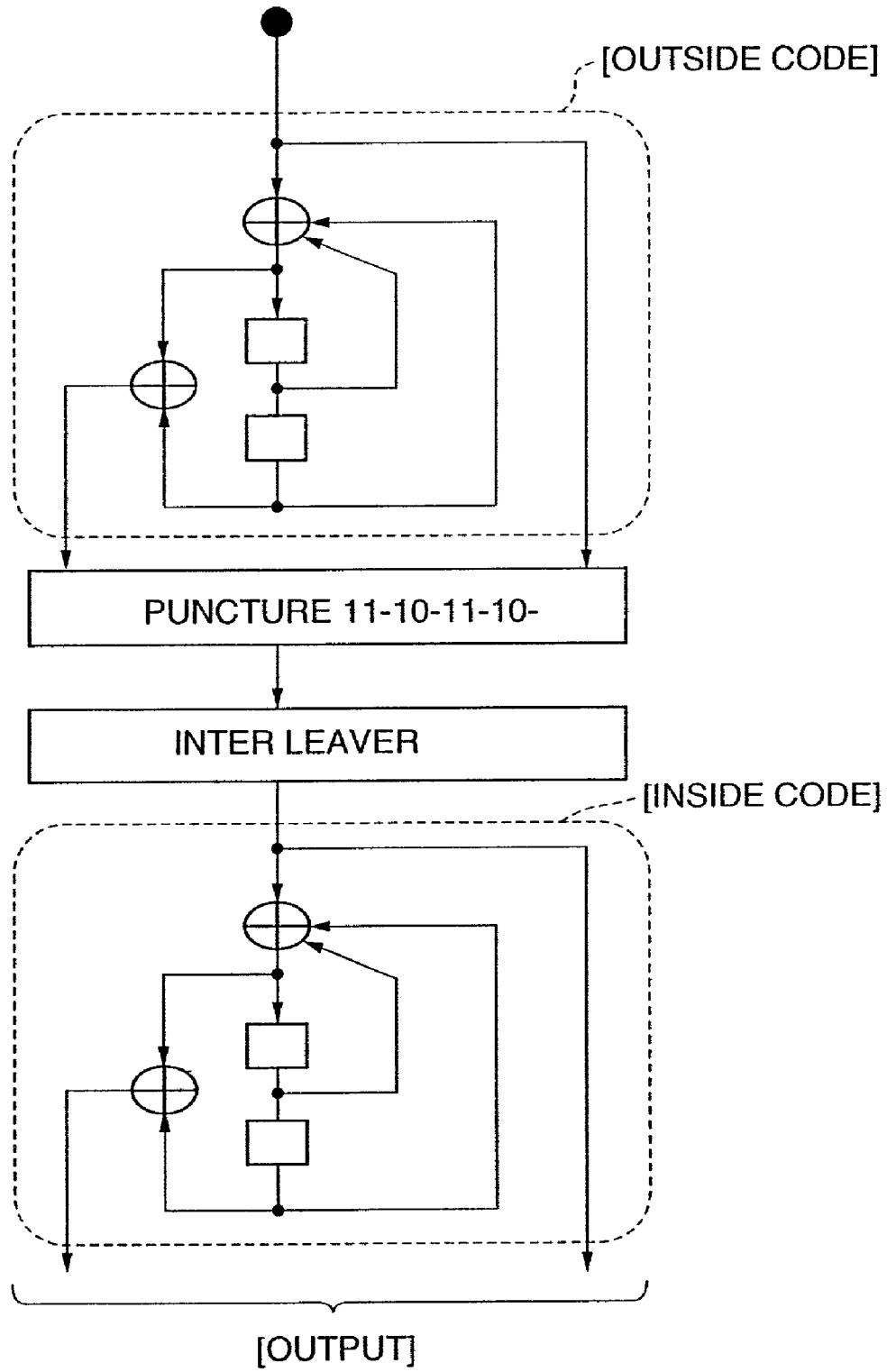
FIG. 13 is a block diagram showing series concatenation turbo coding.

A case where the present invention is applied to parallel and series concatenation turbo coding will be described next. FIG. 12 shows parallel concatenation turbo coding. FIG. 13 shows series concatenation turbo coding. As is obvious from FIGS. 12 and 13, component coding takes the same structure regardless of whether the coding is of a parallel concatenation type or series concatenation type. Obviously, therefore, the present invention can be applied to the BCJR algorithm by the same method described above. This method is disclosed in detail in Japanese Patent Application No. 11-192467.

FIG. 13 shows ACS computation in which correction terms based on the Jacobian logarithm are added. By replacing the ACS computation in the present invention with the means shown in FIG. 14, a turbo decoder to which the Jacobian logarithm is applied can be realized.

That ACS computation in which correction terms based on the Jacobian logarithm are added is equivalent to semiring will be described below. According to the Jacobian logarithm, by looking up a correction term $$f_c(|\delta_1 - \delta_2|) \quad (74)$$

as a function of $$|\delta_1 - \delta_2| \quad (75)$$

in a table, a computation equivalent to the BCJR algorithm is performed in a logarithmic domain, and the Jacobian logarithm is based on the following computation:

$$\ln(e^{\delta_1} + e^{\delta_2}) = \max(\delta_1, \delta_2) + \ln(1 + e^{-|\delta_2 - \delta_1|}) = \max(\delta_1, \delta_2) + f_c(|\delta_2 - \delta_1|) \quad (76)$$

If this operation is fitted in the above semiring, for example, $$\begin{aligned} a \otimes (b \oplus c) &= a + \{\max(a, b) + f_c(|b - c|)\} \\ &= \max\{(a + b), (a + c)\} + f_c\{|(a + b) - (a + c)|\} \\ &= (a \otimes b) \oplus (a \otimes c) \end{aligned} \quad (77)$$

Likewise, $$\begin{aligned} (b \oplus c) \otimes a &= \{\max(b, c) + f_c(|c - b|)\} + a \\ &= \max\{(b + a), (c + a)\} + f_c\{|(c + a) - (b + a)|\} \\ &= (b \otimes a) \oplus (c \otimes a) \end{aligned} \quad (78)$$

That is, the Jacobian logarithm satisfies the distributive law in the semiring. In addition, in computation $$\oplus \quad (79)$$

a combination law is expressed by $$(\alpha \oplus b) \oplus c = \ln(e^a + e^b + e^c) = \alpha \oplus (b \oplus c) \quad (79)$$

That is, if $$(\alpha \oplus b) = A = \ln(e^a + e^b) = \ln(e^A) \quad (81)$$

the lefthand side of the above equation is equivalent to the following computation:

$$(\alpha \oplus b) \oplus c = \ln(e^A + e^c) = A \oplus c \quad (82)$$

If $$(b \oplus c) = C = \ln(e^b + e^c) = \ln(e^C) \quad (83)$$

the righthand side of the above equation is equivalent to the following computation:

$$(\alpha \oplus b) \oplus c = \ln(e^a + e^C) = \alpha \oplus C \quad (84)$$

Therefore, $$\ln(e^a + e^b + e^c) \quad (85)$$

In computation $$\oplus \quad (86)$$

unit element m ($=-\infty$) becomes $$(\alpha \oplus m) = \ln(e^a + e^m) = \ln(e^a + 0) = \alpha \quad (87)$$

The above logic can be used without any change.

The remaining operation is obvious, and hence a description thereof will be omitted.

The following is a computation actually performed by using the Jacobian logarithm with a semiring property:

$$\vec{A} \otimes (\vec{B} \otimes \vec{S}) = \vec{A} \otimes \left\{ \begin{bmatrix} b_{11} & - & - & b_{1n} \\ | & - & - & | \\ | & - & - & | \\ b_{n1} & - & - & b_{nn} \end{bmatrix} \otimes \begin{bmatrix} s_1 \\ | \\ | \\ s_n \end{bmatrix} \right\} \quad (88)$$

$$= \vec{A} \otimes \begin{bmatrix} \sum_i b_{1i} \otimes s_i \\ | \\ | \\ \sum_i b_{ni} \otimes s_i \end{bmatrix} = \begin{bmatrix} a_{11} & - & - & a_{1n} \\ | & - & - & | \\ | & - & - & | \\ a_{n1} & - & - & a_{nn} \end{bmatrix} \otimes \begin{bmatrix} \sum_i b_{1i} \otimes s_i \\ | \\ | \\ \sum_i b_{ni} \otimes s_i \end{bmatrix}$$

$$= \begin{bmatrix} \sum_j a_{1j} \otimes \left( \sum_i b_{ji} \otimes s_i \right) \\ | \\ | \\ \sum_j a_{nj} \otimes \left( \sum_i b_{ji} \otimes s_i \right) \end{bmatrix} = \begin{bmatrix} \sum_j \sum_i a_{1j} \otimes b_{ji} \otimes s_i \\ | \\ | \\ \sum_j \sum_i a_{nj} \otimes b_{ji} \otimes s_i \end{bmatrix}$$

Figure 14:
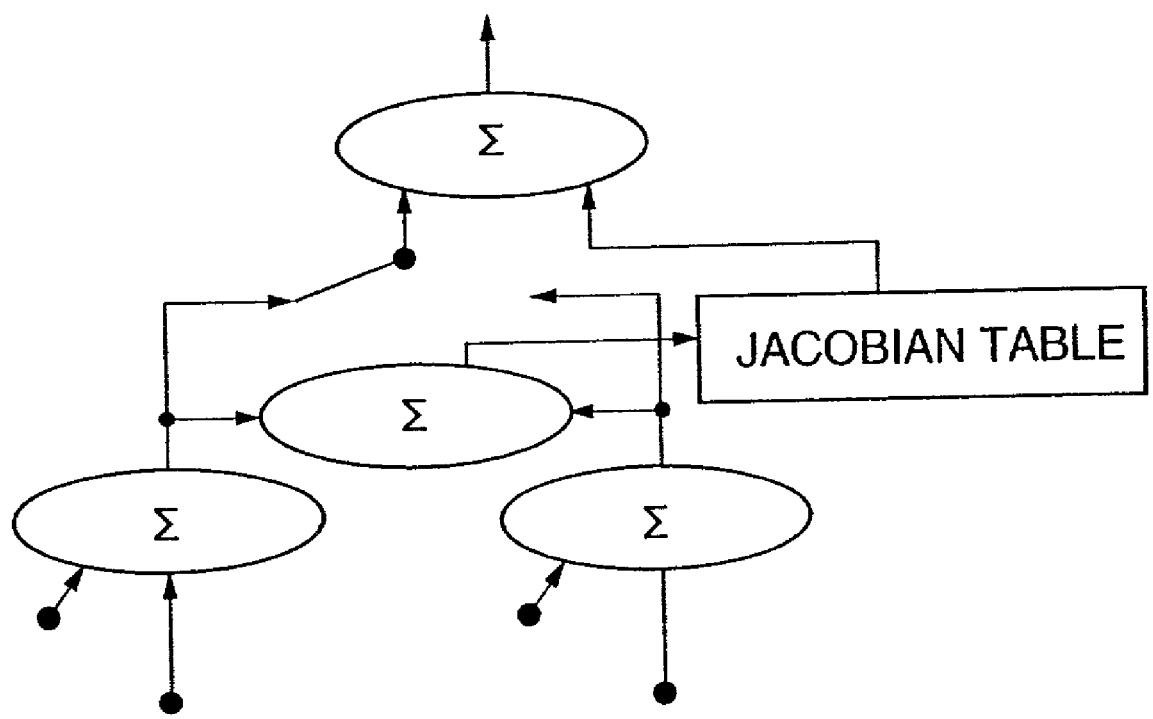
FIG. 14 is a block diagram showing an example of the Jacobian logarithm for parallel concatenation turbo coding.
Figure 15:
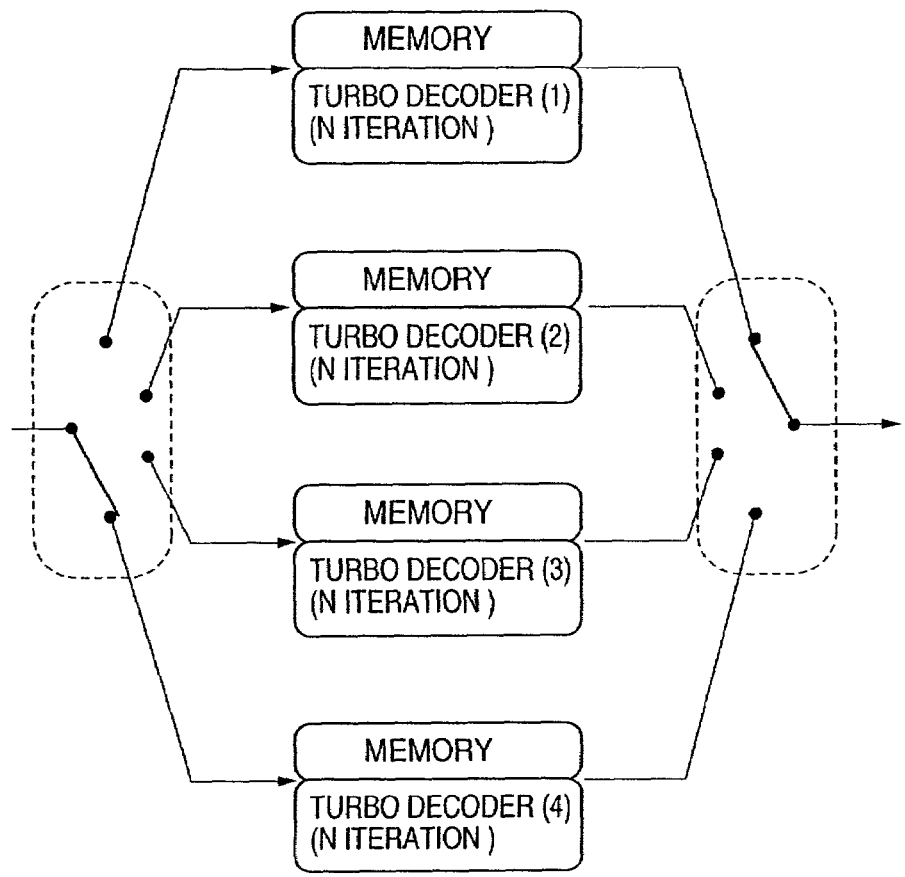
FIG. 15 is a view showing an example of conventional concurrent operation using switches.
Figure 15:
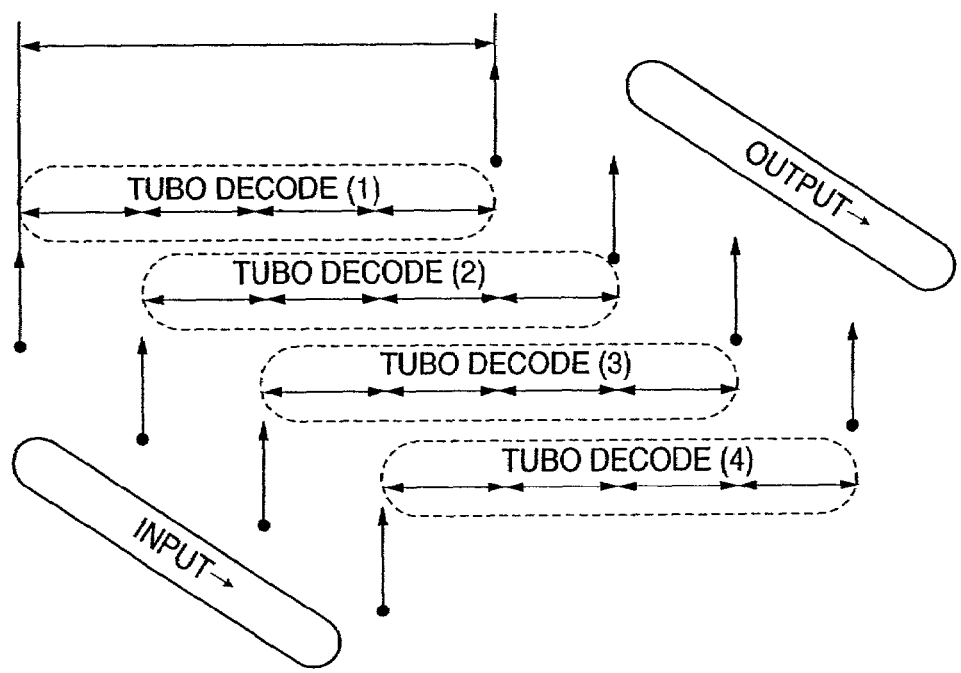
Figure 16:
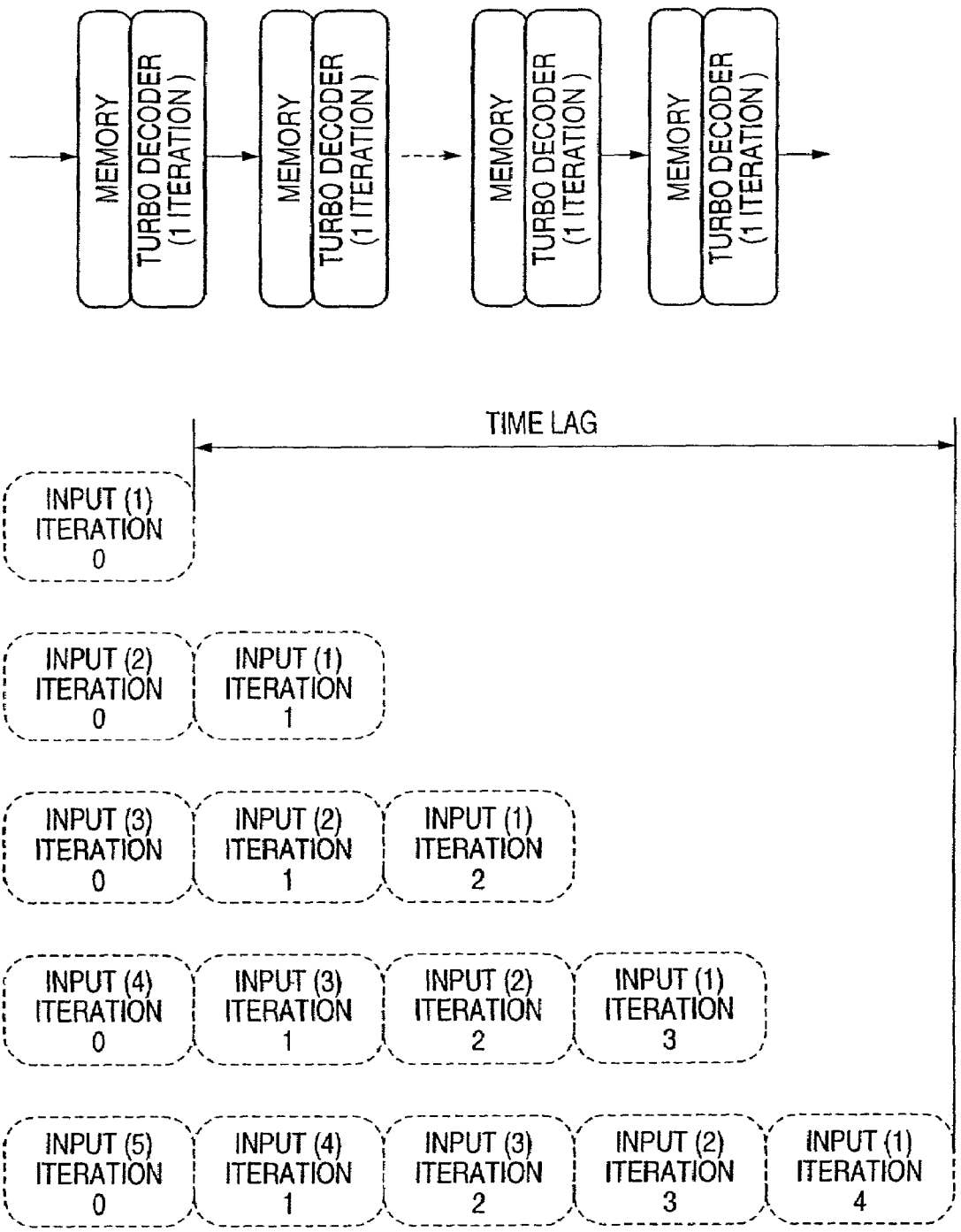
FIG. 16 is a view showing an example of a conventional pipelined cascade connection.

[ ∵ distributive law $a \otimes (b \oplus C) = a \otimes b \oplus a \otimes c$ ]
where $\sum$ is computation of $\oplus$.
For example, if $n = 4$, $$\vec{A} \otimes (\vec{B} \otimes \vec{S}) = \begin{bmatrix} a11 & a12 & a13 & a14 \\ a21 & a22 & a23 & a24 \\ a31 & a32 & a33 & a34 \\ a41 & a42 & a43 & a44 \end{bmatrix} \otimes \begin{bmatrix} (b_{11} \otimes s_1) \oplus (b_{12} \otimes s_2) \oplus (b_{13} \otimes s_3) \oplus (b_{14} \otimes s_4) \\ (b_{21} \otimes s_1) \oplus (b_{22} \otimes s_2) \oplus (b_{23} \otimes s_3) \oplus (b_{24} \otimes s_4) \\ (b_{31} \otimes s_1) \oplus (b_{32} \otimes s_2) \oplus (b_{33} \otimes s_3) \oplus (b_{34} \otimes s_4) \\ (b_{41} \otimes s_1) \oplus (b_{42} \otimes s_2) \oplus (b_{43} \otimes s_3) \oplus (b_{44} \otimes s_4) \end{bmatrix} \quad (89)$$

$$= \begin{bmatrix} \sum_j a_{1j} \otimes \{(b_{j1} \otimes s_1) \oplus (b_{j2} \otimes s_2) \oplus (b_{j3} \otimes s_3) \oplus (b_{j4} \otimes s_4)\} \\ \sum_j a_{2j} \otimes \{(b_{j1} \otimes s_1) \oplus (b_{j2} \otimes s_2) \oplus (b_{j3} \otimes s_3) \oplus (b_{j4} \otimes s_4)\} \\ \sum_j a_{3j} \otimes \{(b_{j1} \otimes s_1) \oplus (b_{j2} \otimes s_2) \oplus (b_{j3} \otimes s_3) \oplus (b_{j4} \otimes s_4)\} \\ \sum_j a_{4j} \otimes \{(b_{j1} \otimes s_1) \oplus (b_{j2} \otimes s_2) \oplus (b_{j3} \otimes s_3) \oplus (b_{j4} \otimes s_4)\} \end{bmatrix}$$

where $\sum$ is computation of $\oplus$.
In the above equation, $$(b_{11} \otimes s_1) \oplus (b_{12} \otimes s_2) \oplus (b_{13} \otimes s_3) \oplus (b_{14} \otimes s_4) \quad (90)$$

can be sequentially computed by the following method, and can be implemented by using the above hardware arrangement and the processing shown in FIG. 14.

In computing $$a \oplus b \oplus c \oplus d \quad (91)$$

first of all, $$\alpha \oplus b = \ln(e^a + e^b) = \ln\{e^\alpha\} = \alpha \quad (92)$$

is calculated, and then $$c \oplus d = \ln(e^c + e^d) = \ln\{e^\beta\} = \beta \quad (93)$$

is calculated.

Finally, $$\alpha \oplus \beta = \ln(e^\alpha + e^\beta) = \ln\{e^\lambda\} = \lambda \quad (94)$$

is calculated to obtain $$a \oplus b \oplus c \oplus d = \{\ln\{e^a + e^b\}\} \oplus \{\ln\{e^c + e^d\}\} = \alpha \oplus \beta = \ln\{e^\alpha + e^\beta\} = \ln\{e^\lambda\} = \lambda \quad (95)$$

Therefore, the same result as described above can be obtained even by sequential computation.

On the other hand, $$\left(\vec{A} \otimes \vec{B}\right) \otimes \vec{S} = \left\{\begin{bmatrix} a_{11} & - & - & a_{1n} \\ | & - & - & | \\ | & - & - & | \\ a_{n1} & - & - & a_{nn} \end{bmatrix} \otimes \begin{bmatrix} b_{11} & - & - & b_{1n} \\ | & - & - & | \\ | & - & - & | \\ b_{n1} & - & - & b_{nn} \end{bmatrix}\right\} \otimes \quad (96)$$

$$\begin{bmatrix} s_1 \\ | \\ | \\ s_n \end{bmatrix}$$

$$= \begin{bmatrix} \sum_i a_{1i} \otimes b_{i1} & - & - & \sum_i a_{1i} \otimes b_{in} \\ | & - & - & | \\ | & - & - & | \\ \sum_i a_{ni} \otimes b_{i1} & - & - & \sum_i a_{ni} \otimes b_{in} \end{bmatrix} \otimes \begin{bmatrix} s_1 \\ | \\ | \\ s_n \end{bmatrix}$$

$$= \begin{bmatrix} \sum_j \left(\sum_i a_{1i} \otimes b_i\right) \otimes s_j \\ | \\ | \\ \sum_j \left(\sum_i a_{ni} \otimes\right) \otimes s_j \end{bmatrix}$$

$$= \begin{bmatrix} \sum_j \sum_i a_{1i} \otimes b_{ij} \otimes s_j \\ | \\ | \\ \sum_j \sum_i a_{nj} \otimes b_{ij} \otimes s_j \end{bmatrix}$$

[∵ distributive law $(b \oplus C) \otimes \alpha = b \otimes \alpha \oplus c \otimes \alpha$]

where $\sum$ is computation of $\oplus$.

If, therefore, i and j are replaced, this equation becomes identical to the above equation. As a consequence, in the Jacobian logarithm as well, the following equation holds:

$$\vec{A}\otimes(\vec{B}\otimes\vec{S})=(\vec{A}\otimes\vec{B})\otimes\vec{S} \quad (97)$$

By sequentially using this relationship, the technique of increasing the processing speed by changing the sequence of the above ACS computation:

$$\vec{A}\otimes\{\vec{B}\otimes(\vec{C}\otimes\vec{S})\}=\vec{A}\otimes\{(\vec{B}\otimes\vec{C})\oplus\vec{S}\}=\{\vec{A}\otimes(\vec{B}\otimes\vec{C})\}\oplus\vec{S} \quad (98)$$

can be applied to the Jacobian logarithm without any change, and the number of terms can be arbitrarily increased according to the same theory as described above.

That is, the present invention can be applied to a case where the ACS computation based on the Jacobian logarithm in FIG. 14 is used.

What is claimed is:

1. A high-speed turbo decoder using a BCJR (Bahl, Cocke, Jelinek, and Raviv) algorithm or a BCJR algorithm which makes approximation by ACS (Add-Compare-Select) computation, comprising, in order to perform at least one of alpha metric computation and beta metric computation in the BCJR algorithm:

means for supplying a plurality of pipelined stages of gamma metrics;

ACS computation means constituted of a plurality of stages of cascade connections which receives the plurality of pipelined gamma metrics;

means for receiving a computation result obtained by said ACS computation means and thereby updating state metrics every plurality of stages (K stages); and means for storing state metrics for every K stages.

2. A decoder according to claim 1, wherein said state metric updating means is of a sliding window type, whereby update progress of each of state metrics is indicated in a window for every K stages.

3. A high-speed turbo decoder using a BCJR (Bahl, Cocke, Jelinek, and Raviv) algorithm or a BCJR algorithm which makes approximation by ACS (Add-Compare-Select) computation, comprising, in order to perform at least one of alpha metric computation and beta metric computation in the BCJR algorithm:

means for supplying a plurality of pipelined stages of gamma metrics;

ACS computation means constituted of a plurality of stages of cascade connections which receives the plurality of pipelined gamma metrics;

means for receiving a computation result obtained by said ACS computation means and thereby updating state metrics every plurality of stages (K stages); and another ACS computation means constituted of a plurality of stages of cascade connections which receives state metric updating results for every K stages and a plurality of pipelined stages of gamma metrics, wherein likelihood computation is performed on the basis of a computation result obtained by each stage of said ACS computation means constituted of the cascade connections.

4. A decoder according to claim 3, wherein computation results obtained by the respective stages of said another ACS computation means constituted of a plurality of cascade connections which receives state metric updating results for every K stages and gamma metrics at the plurality of pipelined stages are computation results on state and gamma metrics used in the ACS computation, and thereby performing likelihood computation on the basis of the computation results.

5. A high-speed turbo decoder using a BCJR (Bahl, Cocke, Jelinek, and Raviv) algorithm or a BCJR algorithm which makes approximation by ACS (Add-Compare-Select) computation, comprising, in order to perform at least one of alpha metric computation and beta metric computation in the BCJR algorithm:

means for receiving values of stored state metrics for every plurality of stages (K stages) as first inputs and thereby supplying a plurality of pipelined stages of gamma metrics; and ACS computation means constituted of a plurality of stages of cascade connections which receives the plurality of pipelined stages of gamma metrics as second inputs, wherein likelihood computation is performed on the basis of computation results at the respective stages of said ACS computation means constituted of the cascade connections.

6. A high-speed turbo decoder using a BCJR (Bahl, Cocke, Jelinek, and Raviv) algorithm or a BCJR algorithm=which makes approximation by ACS (Add-Compare-Select) computation, comprising:

(a) a first section including, in order to perform at least one of alpha metric computation and beta metric computation in the BCJR algorithm:
    means for supplying a plurality of pipelined stages of gamma metrics;
    ACS computation means constituted of a plurality of stages of cascade connections which receives the plurality of pipelined stages of gamma metrics;
    means for receiving computation results obtained by said ACS computation means and thereby updating state metrics every plurality of stages (K stages); and
    means for storing the state metrics for every plurality of stages,
(b) a second section including, in order to perform the other one of alpha metric computation and beta metric computation in the BCJR algorithm:
    means for supplying a plurality of pipelined stages of gamma metrics;
    ACS computation means constituted of a plurality of stages of cascade connections which receives the plurality of pipelined stages of gamma metrics;
    means for receiving computation results obtained by said ACS computation means and thereby updating state metrics every plurality of stages (K stages); and
    another ACS computation means constituted of a plurality of stages of cascade connections which receives state metric updating results for every K stages and the plurality of pipelined stages of gamma metrics;
    wherein a computation result in each stage of said another ACS computation means constituted of the cascade connections becomes a first input for likelihood computation;
and
(c) a third section including:
    means for supplying a plurality of pipelined stages of gamma metrics; and
    still another ACS computation means constituted of a plurality of stages of cascade connections which receives values of the stored state metrics for every K stages as first inputs and receives the plurality of pipelined stages of gamma metrics as second inputs;
    wherein a computation result in each stage of said still another ACS computation means constituted of the cascade connections becomes a second input for likelihood computation,
    thus the likelihood computation is performed while the first and second inputs for the likelihood computation are synchronized with each other by using delay means.

7. A decoder according to claim 1, wherein out of plural stages of computations by said ACS computation means constituted of the plurality of stages of cascade connections, computation at a first stage becomes addition, and a second and subsequent stages become computations each constructed by a trellis structure constituted of parallel components.

8. A decoder according to claim 2, wherein out of plural stages of computations by said ACS computation means constituted of the plurality of stages of cascade connections, computation at a first stage becomes addition, and a second and subsequent stages become computations each constructed by a trellis structure constituted by parallel components.

9. A decoder according to claim 1, wherein said means for updating the state metrics every plurality of stages (K stages) is adapted to receive computation results, as first inputs, sent from all nodes indicating states before updating to the respective nodes indicating states after updating and receive computation results obtained by said ACS computation means, as second inputs, constituted of the plurality of stages of cascade connections, whereby ACS computation based on inputs corresponding to the number of nodes indicating states is performed.

10. A decoder according to claim 2, wherein said means for updating the state metrics every plurality of stages (K stages) is adapted to receive computation results, as first inputs, sent from all nodes indicating states before updating to the respective nodes indicating states after updating and receive computation results obtained by said ACS computation means, as second inputs, constituted of the plurality of stages of cascade connections, whereby ACS computation based on inputs corresponding to the number of nodes indicating states is performed.

11. A decoder according to claim 7, wherein said means for updating the state metrics every plurality of stages (K stages) is adapted to receive computation results, as first inputs, sent from all nodes indicating states before updating to the respective nodes indicating states after updating and receive computation results obtained by said ACS computation means, as second inputs, constituted of the plurality of stages of cascade connections, whereby ACS computation based on inputs corresponding to the number of nodes indicating states is performed.

12. A decoder according to claim 3, wherein out of plural stages of computations by said ACS computation means constituted of the plurality of stages of cascade connections which receives the plurality of pipelined stages of gamma metrics, computation at a first stage becomes addition, and a second and subsequent stages become computations by said ACS computation means each constructed by a trellis structure constituted of parallel components.

13. A decoder according to claim 4, wherein out of plural stages of computations by said ACS computation means constituted of the plurality of stages of cascade connections which receives the plurality of pipelined stages of gamma metrics, computation at a first stage becomes addition, and a second and subsequent stages become computations by said ACS computation means each constructed by a trellis structure constituted of parallel components.

14. A decoder according to claim 3, wherein said means for updating the state metrics every plurality of stages (K stages) is adapted to receive computation results, as first inputs, sent from all nodes indicating states before updating to the respective nodes indicating states after updating and receive computation results obtained by said ACS computation means, as second inputs, constituted of the plurality of stages of cascade connections, whereby ACS computation based on inputs corresponding to the number of nodes indicating states is performed.

15. A decoder according to claim 4, wherein said means for updating the state metrics every plurality of stages (K stages) is adapted to receive computation results, as first inputs, sent from all nodes indicating states before updating to the respective nodes indicating states after updating and receive computation results obtained by said ACS computation means, as second inputs, constituted of the plurality of stages of cascade connections, whereby ACS computation based on inputs corresponding to the number of nodes indicating states is performed.

16. A decoder according to claim 12, wherein said means for updating the state metrics every plurality of stages (K stages) is adapted to receive computation results, as first inputs, sent from all nodes indicating states before updating to the respective nodes indicating states after updating and receive computation results obtained by said ACS computation means, as second inputs, constituted of the plurality of stages of cascade connections, whereby ACS computation based on inputs corresponding to the number of nodes indicating states is performed.

17. A decoder according to claim 1, wherein a parallel concatenation encoding method is used as a turbo code encoding method.

18. A decoder according to claim 3, wherein a parallel concatenation encoding method is used as a turbo code encoding method.

19. A decoder according to claim 5, wherein a parallel concatenation encoding method is used as a turbo code encoding method.

20. A decoder according to claim 6, wherein a parallel concatenation encoding method is used as a turbo code encoding method.

21. A decoder according to claim 1, wherein a series concatenation encoding method is used as a turbo code encoding method.

22. A decoder according to claim 3, wherein a series concatenation encoding method is used as a turbo code encoding method.

23. A decoder according to claim 5, wherein a series concatenation encoding method is used as a turbo code encoding method.

24. A decoder according to claim 6, wherein a series concatenation encoding method is used as a turbo code encoding method.

25. A decoder according to claim 1, wherein in the ACS computation, correction values based on a Jacobian logarithm are added.

26. A decoder according to claim 3, wherein in the ACS computation, correction values based on a Jacobian logarithm are added.

27. A decoder according to claim 5, wherein in the ACS computation, correction values based on a Jacobian logarithm are added.

28. A decoder according to claim 6, wherein in the ACS computation, correction values based on a Jacobian logarithm are added.

29. A decoder according to claim 6, wherein a series concatenation encoding method is used as a turbo code encoding method.

30. A decoder according to claim 7, wherein a series concatenation encoding method is used as a turbo code encoding method.

31. A decoder according to claim 8, wherein a series concatenation encoding method is used as a turbo code encoding method.

32. A decoder according to claim 9, wherein a series concatenation encoding method is used as a turbo code encoding method.

33. A decoder according to claim 10, wherein a series concatenation encoding method is used as a turbo code encoding method.

* * * * *